(12) United States Patent
Yun et al.

(10) Patent No.: US 11,563,108 B2
(45) Date of Patent: Jan. 24, 2023

(54) SEMICONDUCTOR DEVICES

(71) Applicant: SAMSUNG ELECTRONICS CO., LTD., Suwon-si (KR)

(72) Inventors: Seungchan Yun, Suwon-si (KR); Donghwan Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/011,444

(22) Filed: Sep. 3, 2020

(65) Prior Publication Data
US 2021/0159327 A1 May 27, 2021

(30) Foreign Application Priority Data
Nov. 26, 2019 (KR) .................. 10-2019-0152986

(51) Int. Cl.
*H01L 29/66* (2006.01)
*H01L 29/78* (2006.01)
*H01L 21/8234* (2006.01)
*H01L 21/84* (2006.01)

(52) U.S. Cl.
CPC .... *H01L 29/66795* (2013.01); *H01L 29/7827* (2013.01); *H01L 21/823418* (2013.01); *H01L 21/845* (2013.01)

(58) Field of Classification Search
CPC ....... H01L 29/66795; H01L 21/823418; H01L 21/845; H01L 27/0629; H01L 28/20; H01L 28/60; H01L 29/0847; H01L 29/66666; H01L 29/78642; H01L 21/8232; H01L 21/8252; H01L 27/0635; H01L 21/28141; H01L 21/76897; H01L 21/823487; H01L 29/66712–66734; H01L 29/7802–7815; H01L 29/7827–7828; H01L 51/057; H01L 29/73229
See application file for complete search history.

(56) References Cited

U.S. PATENT DOCUMENTS

| | | |
|---|---|---|
| 6,483,168 B1 | 11/2002 | Chiu |
| 6,720,231 B2 | 4/2004 | Fried et al. |
| 7,804,155 B2 | 9/2010 | Chi |

(Continued)

*Primary Examiner* — Cuong B Nguyen
(74) *Attorney, Agent, or Firm* — F. Chau & Associates, LLC

(57) ABSTRACT

A semiconductor device including: a first structure including: a first semiconductor pattern protruding from a substrate, the first semiconductor pattern being a channel; a first conductive pattern surrounding the first semiconductor pattern, the first conductive pattern being a gate electrode; a first impurity region under the first semiconductor pattern, the first impurity region contacting the first semiconductor pattern, the first impurity region being a source or drain region; and a second impurity region contacting the first semiconductor pattern, the second impurity region being the other of the source or drain region; and a second structure including: second semiconductor patterns spaced apart from each other, each of the second semiconductor patterns protruding from the substrate; second conductive patterns surrounding the second semiconductor patterns, respectively; and first contact plugs connected to the second conductive patterns, wherein the first structure is a vfet, and the second structure includes a resistor or a capacitor.

17 Claims, 36 Drawing Sheets

(56) References Cited

U.S. PATENT DOCUMENTS

| | | |
|---|---|---|
| 8,148,776 B2 | 4/2012 | Juengling |
| 8,796,772 B2 | 8/2014 | Yeh et al. |
| 8,816,436 B2 | 8/2014 | Cheng et al. |
| 9,960,271 B1 | 5/2018 | Xie et al. |
| 10,109,708 B2 | 10/2018 | Luo et al. |
| 10,243,034 B2 | 3/2019 | Lee et al. |
| 2012/0181622 A1 | 7/2012 | Masuoka et al. |
| 2016/0284712 A1* | 9/2016 | Liaw ................ H01L 29/66666 |
| 2019/0088767 A1* | 3/2019 | Xie .................. H01L 29/66545 |

* cited by examiner

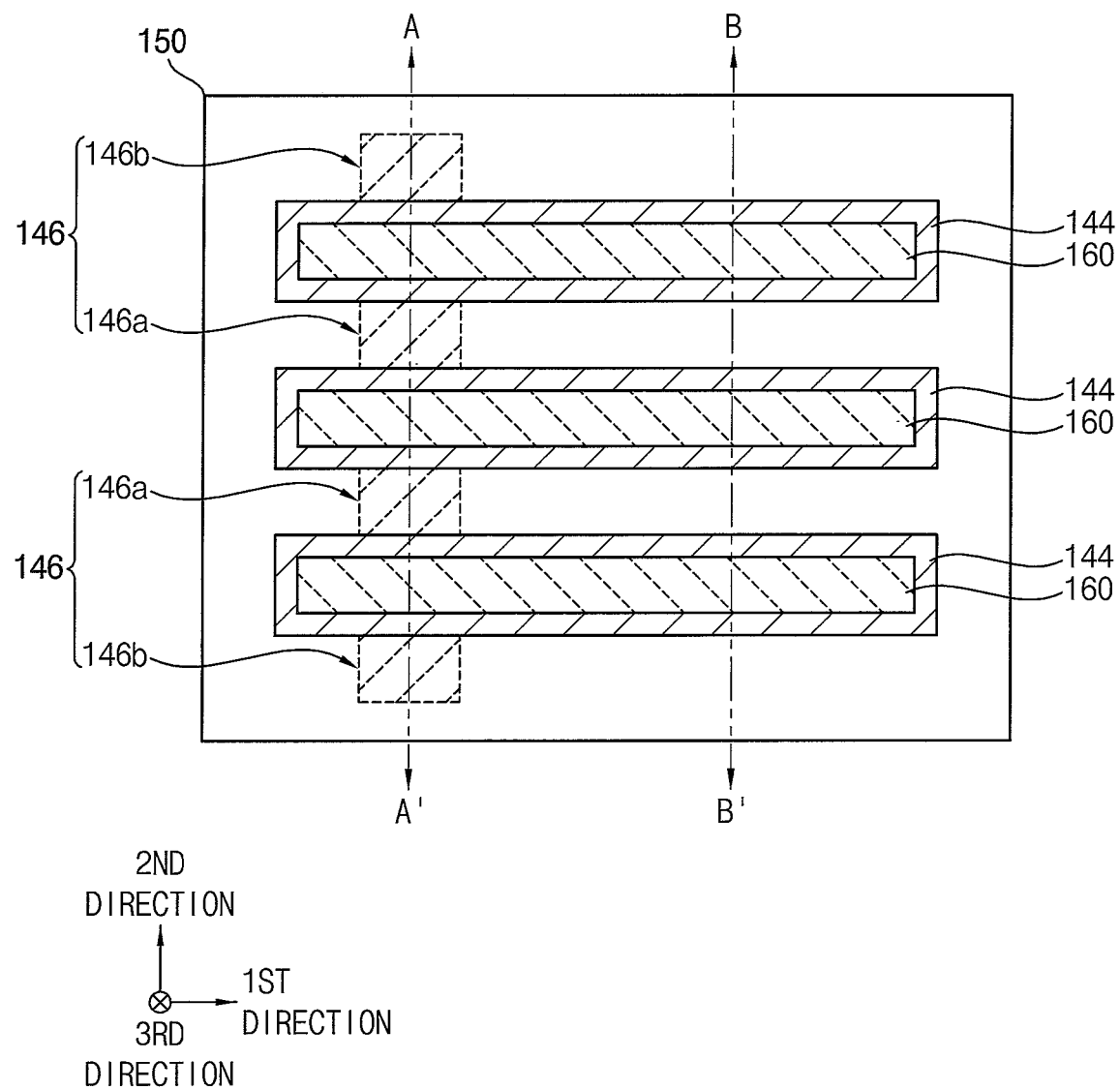

FIG. 17
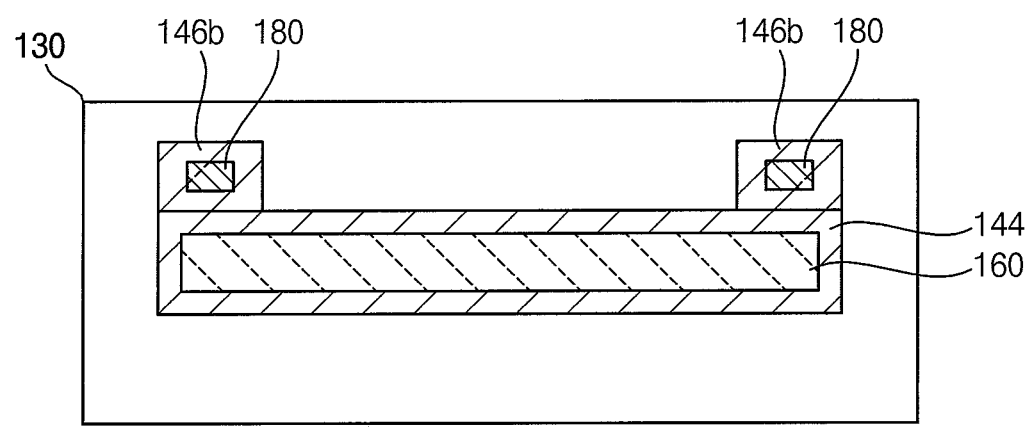
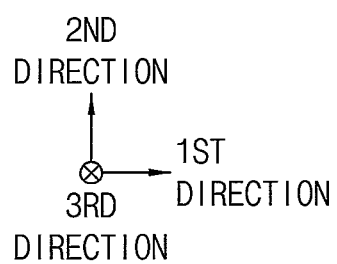

FIG. 18
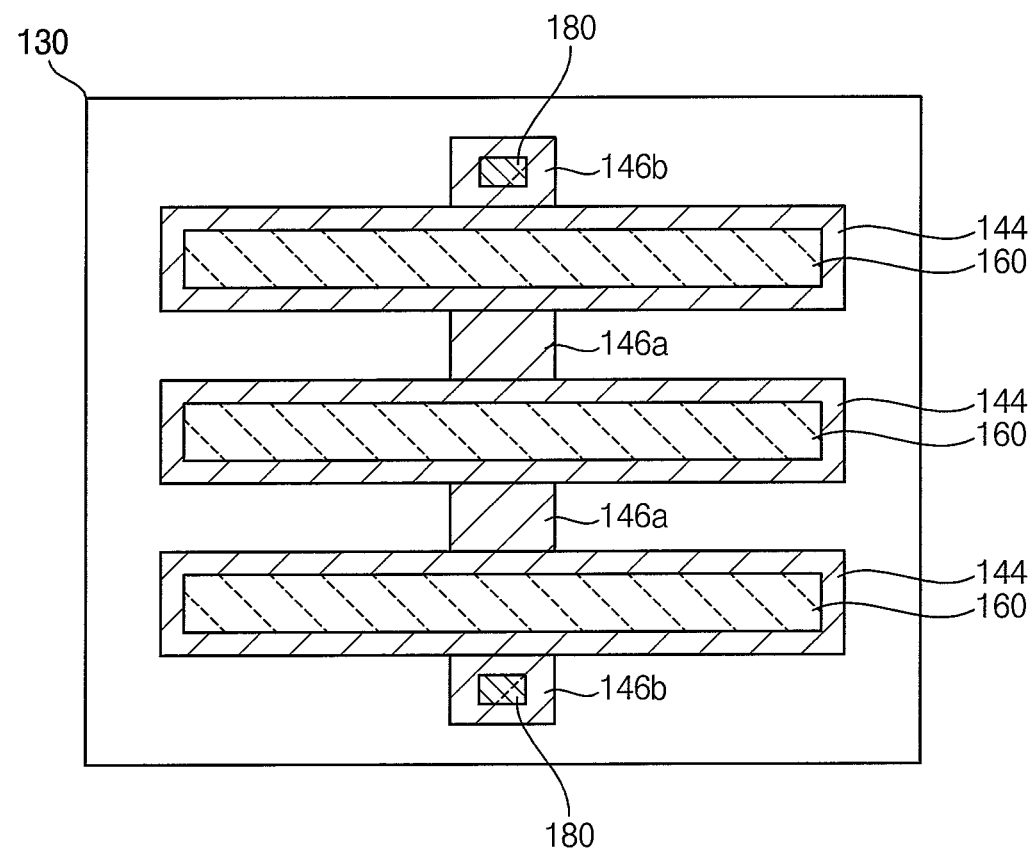
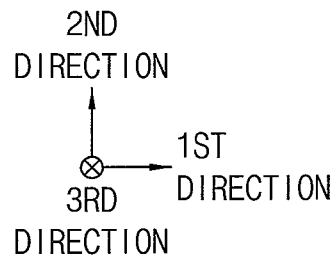

FIG. 19
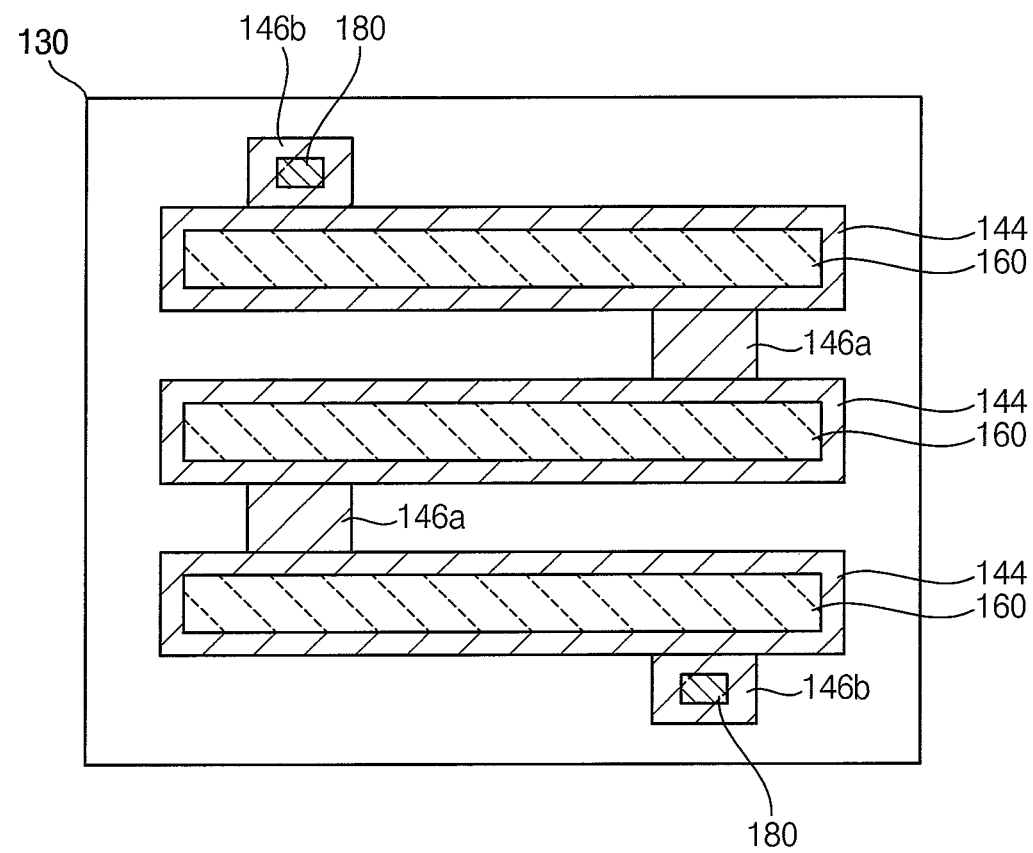
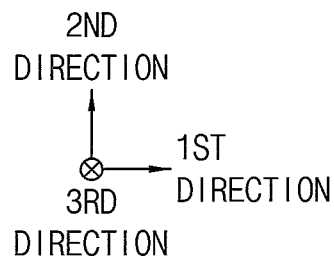

FIG. 24
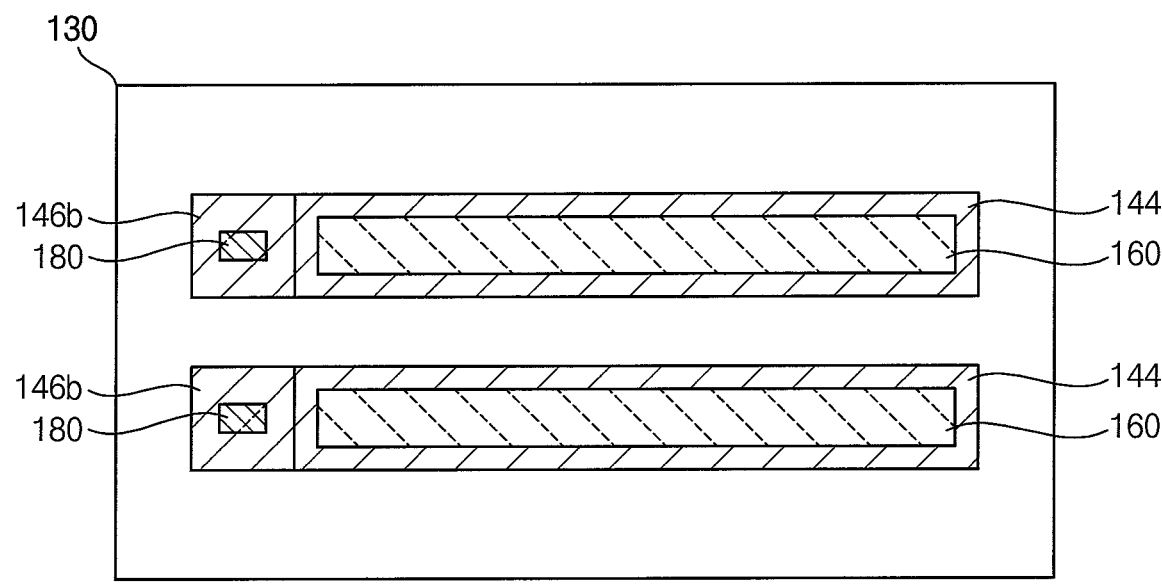
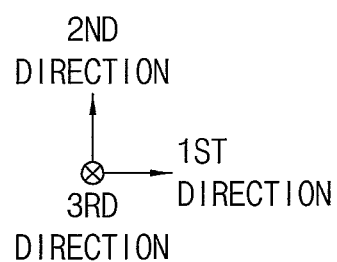

SEMICONDUCTOR DEVICES

CROSS-REFERENCE TO RELATED APPLICATION

This application claims priority under 35 U.S.C. § 119 to Korean Patent Application No. 10-2019-0152986, filed on Nov. 26, 2019 in the Korean Intellectual Property Office (KIPO), the disclosure of which is incorporated by reference herein in its entirety.

1. Technical Field

Exemplary embodiments of the inventive concept relate to a semiconductor device. More particularly, exemplary embodiments of the inventive concept relate to a semiconductor device including an active element such as transistors and a passive element such as resistors, capacitors, etc.

2. Description of the Related Art

In general, resistors and/or capacitors have a large area, and thus semiconductor devices including the resistors and/or capacitors may not have a high degree of integration. Additionally, transistors, resistors and/or capacitors are formed independently, and thus additional etching masks are used to form the transistors, resistors and/or capacitors, which may increase process time and cost.

SUMMARY

According to an exemplary embodiment of the inventive concept, a semiconductor device includes: a first structure including: a first semiconductor pattern protruding from a substrate in a vertical direction perpendicular to an upper surface of the substrate, the first semiconductor pattern being a channel; a first conductive pattern surrounding an upper sidewall of the first semiconductor pattern and not covering an upper surface of the first semiconductor pattern, the first conductive pattern being a gate electrode; a first lower impurity region at an upper portion of the substrate under the first semiconductor pattern, the first lower impurity region contacting a lower surface of the first semiconductor pattern, the first lower impurity region being a source region or a drain region; and a first upper impurity region contacting the upper surface of the first semiconductor pattern, the first upper impurity region being the other of the source region or the drain region; and a second structure including: second semiconductor patterns spaced apart from each other in a horizontal direction parallel to the upper surface of the substrate, each of the second semiconductor patterns protruding from the substrate in the vertical direction; second conductive patterns surrounding upper sidewalls of the second semiconductor patterns, respectively, and not covering upper surfaces of the second semiconductor patterns; and first contact plugs electrically connected to the second conductive patterns, wherein the first structure is a vertical field effect transistor (vfet), and the second structure includes a resistor or a capacitor.

According to an exemplary embodiment of the inventive concept, a semiconductor device includes: a semiconductor pattern protruding from a substrate in a vertical direction perpendicular to an upper surface of the substrate; a conductive pattern at least partially surrounding an upper sidewall of the semiconductor pattern and not covering an upper surface of the semiconductor pattern; a lower impurity region at an upper portion of the substrate under the semiconductor pattern, the lower impurity region contacting a lower surface of the semiconductor pattern; an upper impurity region contacting the upper surface of the semiconductor pattern; pads connected to the conductive pattern, the pads including substantially the same conductive material as the conductive pattern; and contact plugs on the pads, respectively, wherein no electrical signals are applied to the lower and upper impurity regions, and electrical signals are applied to the conductive pattern through the contact plugs so that the conductive pattern is a resistor.

According to an exemplary embodiment of the inventive concept, a semiconductor device includes: semiconductor patterns each protruding from a substrate in a vertical direction perpendicular to an upper surface of the substrate; conductive patterns surrounding upper sidewalls of the semiconductor patterns, respectively, the conductive patterns not covering upper surfaces of the semiconductor patterns; an insulating interlayer between the conductive patterns; a lower impurity region at an upper portion of the substrate under a respective one of the semiconductor patterns, the lower impurity region contacting a lower surface of the respective one of semiconductor patterns; an upper impurity region contacting an upper surface of the respective one of the semiconductor patterns; pads connected to the conductive patterns, respectively, the pads including substantially the same conductive material as the conductive patterns; and contact plugs on the pads, respectively, wherein no electrical signals are applied to the lower and upper impurity regions, and electrical signals are applied to the conductive patterns through the contact plugs so that the conductive patterns and the insulating interlayer are a capacitor.

According to an exemplary embodiment of the inventive concept, a semiconductor device includes: a plurality of semiconductor patterns extending lengthwise in a first direction on a substrate, the semiconductor patterns protruding from an upper surface of the substrate; an impurity region disposed on an upper surface of each of the semiconductor patterns; a first conductive pattern surrounding sidewalls of each of the semiconductor patterns; a second conductive pattern extending lengthwise in a second direction on the substrate, the second direction crossing the first direction, wherein the second conductive pattern includes connection parts for connecting adjacent first conductive patterns to each other and pads for receiving signals through contact plugs.

BRIEF DESCRIPTION OF THE DRAWINGS

FIGS. 3, 4, 5, 6, 7, 8, 9, 10, 11A and 11B are plan views and cross-sectional views illustrating a method of manufacturing a semiconductor device in accordance with exemplary embodiments of the inventive concept.

FIGS. 17, 18 and 19 are plan views illustrating layouts of semiconductor devices in accordance with exemplary embodiments of the inventive concept.

FIGS. 24, 25 and 26 are plan views illustrating layouts of semiconductor devices in accordance with exemplary embodiments of the inventive concept.

DETAILED DESCRIPTION OF THE EMBODIMENTS

Exemplary embodiments of the inventive concept will be more clearly understood from the following detailed description taken in conjunction with the accompanying drawings.

Hereinafter, two directions substantially parallel to an upper surface of a substrate and crossing each other may be referred to as first and second directions, respectively, and a direction substantially perpendicular to the upper surface of the substrate may be referred to as a third direction. In exemplary embodiments of the inventive concept, the first and second directions may be substantially perpendicular to each other.

Figure 1:
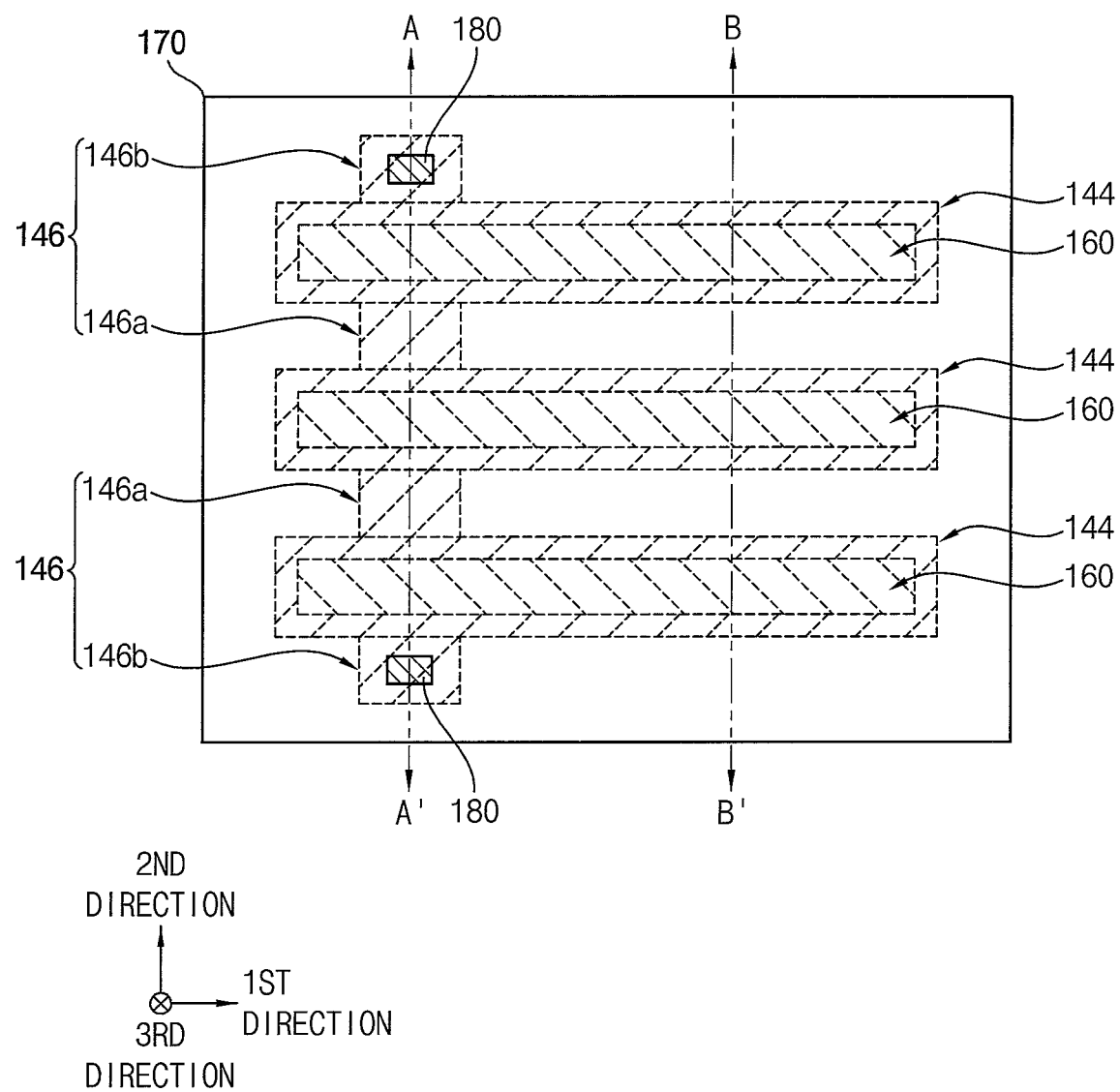
FIGS. 1 and 2 are a plan view and a cross-sectional view, respectively, illustrating a semiconductor device in accordance with exemplary embodiments of the inventive concept.
Figure 2:
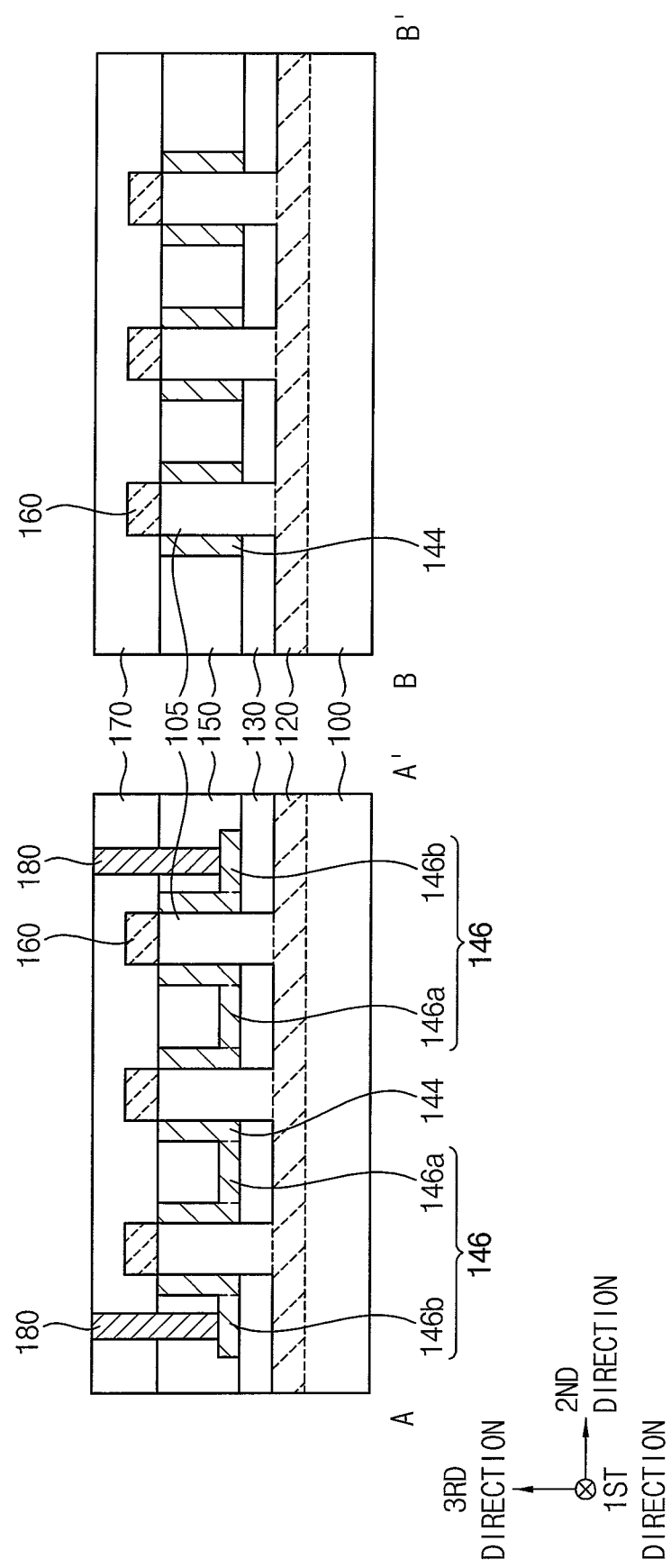

FIGS. 1 and 2 are a plan view and a cross-sectional view, respectively, illustrating a semiconductor device in accordance with exemplary embodiments of the inventive concept. FIG. 2 includes cross-sections taken along lines A-A' and B-B', respectively, of FIG. 1.

Referring to FIGS. 1 and 2, the semiconductor device may include a semiconductor pattern 105 on a substrate 100, lower and upper impurity regions 120 and 160, a spacer 130, first and second conductive patterns 144 and 146, a contact plug 180, and first and second insulating interlayers 150 and 170.

The substrate 100 may include a semiconductor material, e.g., silicon, germanium, silicon-germanium, etc., or III-V semiconductor compounds, e.g., GaP, GaAs, GaSb, etc. In exemplary embodiments of the inventive concept, the substrate 100 may be a silicon-on-insulator (SOI) substrate, or a germanium-on-insulator (GOI) substrate.

The lower impurity region 120 may be formed at an upper portion of the substrate 100, and may include n-type or p-type impurities. The lower impurity region 120 may be formed at an entire upper portion of the substrate 100, or may be partially formed at an upper portion of the substrate 100. In FIGS. 1 and 2, the lower impurity region 120 extends at least in the second direction, however, the inventive concept may not be limited thereto. For example, a plurality of lower impurity regions 120 may be formed under the semiconductor patterns, 105, respectively, to be spaced apart from each other in the second direction. In other words, the lower impurity regions 120 may extend in the first direction.

The semiconductor pattern 105 may protrude from an upper surface of the lower impurity region 120 upwardly in the third direction. For example, the semiconductor pattern 105 may be formed at the upper portion of the substrate 100. The semiconductor pattern 105 may be a remaining portion of an upper portion of the substrate 100 after partially etching an upper portion of the substrate 100, and thus may include substantially the same material as the substrate 100.

In exemplary embodiments of the inventive concept, the semiconductor pattern 105 may extend in the first direction, and a plurality of semiconductor patterns 105 may be spaced apart from each other in the second direction. In FIGS. 1 and 2, three semiconductor patterns 105 spaced apart from each other in the second direction are shown, however, the inventive concept may not be limited thereto, and any number of semiconductor patterns 105 may be formed.

The spacer 130 may be formed on the lower impurity region 120, which may be formed at the upper portion of the substrate 100, and may cover a lower sidewall of each of the semiconductor patterns 105. Thus, the spacer 130 may separate the lower impurity region 120 from the first and second conductive patterns 144 and 146 so that the lower impurity region 120 does not to contact the first and second conductive patterns 144 and 146. The spacer 130 may include an oxide, e.g., silicon oxide or a nitride, e.g., silicon nitride.

The first conductive pattern 144 may be formed on the spacer 130, and may surround and cover an upper sidewall of each of the semiconductor patterns 105.

The second conductive pattern 146 may be formed on the spacer 130 to be connected to the first conductive pattern 144. The second conductive pattern 146 may include a connection pattern 146a and a pad 146b. The connection pattern 146a may be formed between the first conductive patterns 144 covering upper sidewalls of the semiconductor patterns 105, respectively, spaced apart from each other in the second direction. For example, the connection pattern 146a may extend in the second direction between a pair of first conductive patterns 144. The pad 146b may be formed at an outer side of the first conductive patterns 144 in the second direction. For example, the pad 146b may be formed at opposite sides of a group of the first conductive patterns 144 arranged in the second direction.

The first and second conductive patterns 144 and 146 may include substantially the same material, e.g., a metal such as titanium, tantalum, tungsten, copper, aluminum, etc., a metal nitride such as titanium nitride, tantalum nitride, tungsten nitride, etc., an alloy thereof, a metal silicide, etc.

The first insulating interlayer 150 may be formed on the spacer 130 and the second conductive pattern 146, and may cover a sidewall of the first conductive pattern 144. The first insulating interlayer 150 may include an oxide, e.g., silicon oxide or a nitride, e.g., silicon nitride.

The upper impurity region 160 may be formed on each of the semiconductor patterns 105, and may include n-type or p-type impurities. In exemplary embodiments of the inventive concept, the upper impurity region 160 may include impurities having the same conductivity type as impurities of the lower impurity region 120. Referring to FIG. 11B, the upper impurity region 160 may have a cross-section with a pentagon-like shape.

The second insulating interlayer 170 may be formed on the first insulating interlayer 150 and the first conductive pattern 144, and may cover the upper impurity region 160. The second insulating interlayer 170 may include an oxide, e.g., silicon oxide or a nitride, e.g., silicon nitride, and in some cases, may be merged with the first insulating interlayer 150.

The contact plug 180 may extend through the first and second insulating interlayers 150 and 170 to contact an upper surface of the second conductive pattern 146. For example, the contact plug 180 may contact one of the pads 146b. In exemplary embodiments of the inventive concept, a pair of contact plugs 180 may be formed, and each of the contact plugs 180 may be formed on each of the pads 146b. The contact plug 180 may include a metal, a metal nitride, a metal silicide, doped polysilicon, etc.

A first insulation layer including, e.g., silicon oxide and/or a second insulation layer including, e.g., a metal oxide may be further formed between the first and second conductive patterns 144 and 146, and the spacer 130 and the semiconductor patterns 105.

The semiconductor device may include the first conductive pattern 144 covering the upper sidewall of each of the semiconductor patterns 105, and the first conductive pattern 144 may serve as a resistor. Thus, unlike a conventional resistor having a large area on the substrate 100, the first conductive pattern 144, which serves as the resistor, may have a relatively less horizontal area, since the first conductive patter 144 covers the upper sidewall of the semiconductor pattern 105 that protrudes in a vertical direction.

The semiconductor device including the resistor may include substantially the same structure as a transistor illustrated subsequently, except for some elements thereof, and thus may be formed by the same method. Accordingly, additional processes for forming the resistor are not needed, which may decrease the time and cost for fabrication of the semiconductor device.

The first conductive patterns 144 may be connected in series through the connection pattern 146a of the second conductive pattern 146, and thus a desired specific resistivity of the resistors may be easily obtained.

FIGS. 3 to 11B are plan views and cross-sectional views illustrating a method of manufacturing a semiconductor device in accordance with exemplary embodiments of the inventive concept. Particularly, FIGS. 3, 6, 8 and 10 are the plan views, and FIGS. 4-5, 7, 9, 11A and 11B are the cross-sectional views. Each of the cross-sectional views includes cross-sections taken along lines A-A' and B-B' of a corresponding plan view.

Figure 3:
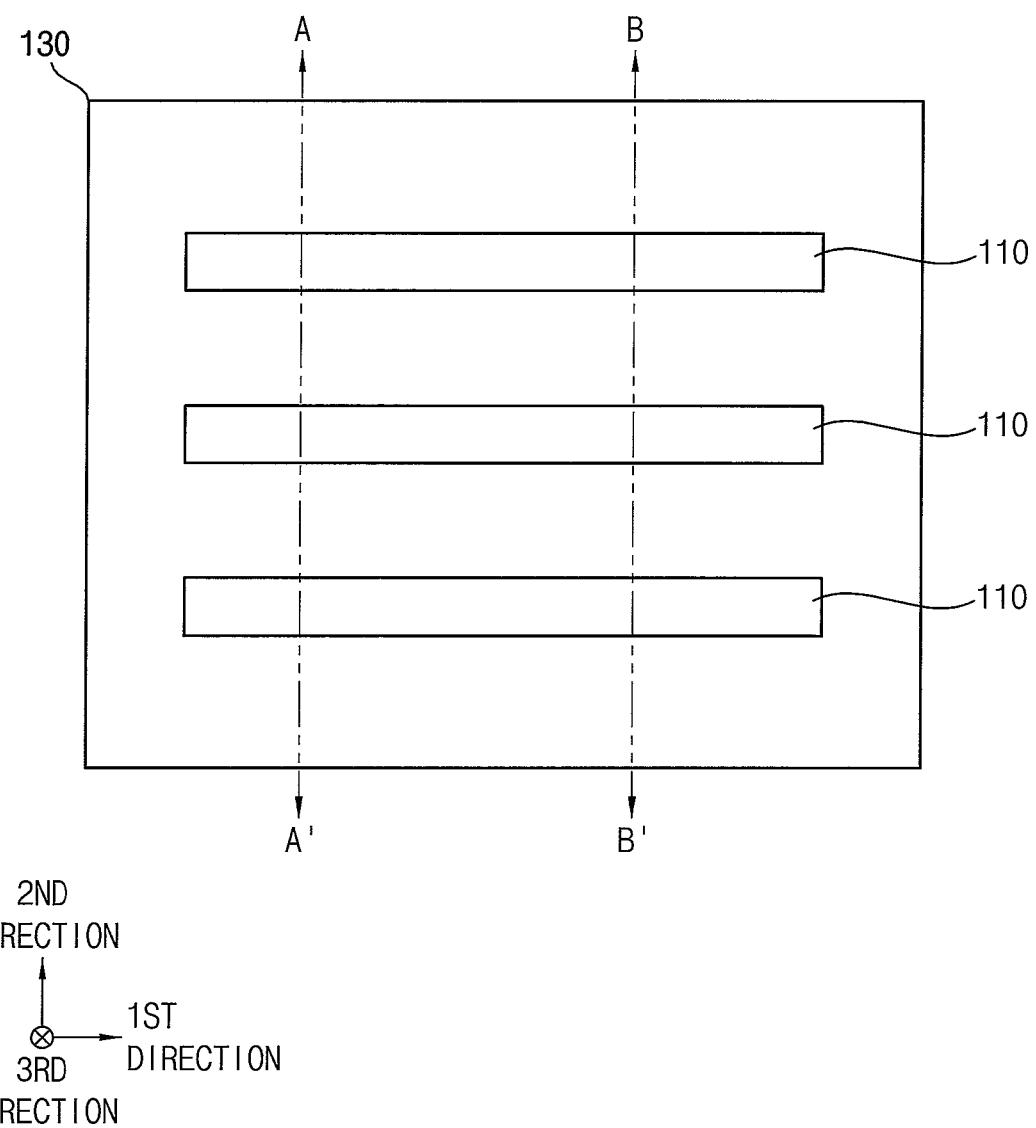
Figure 4:
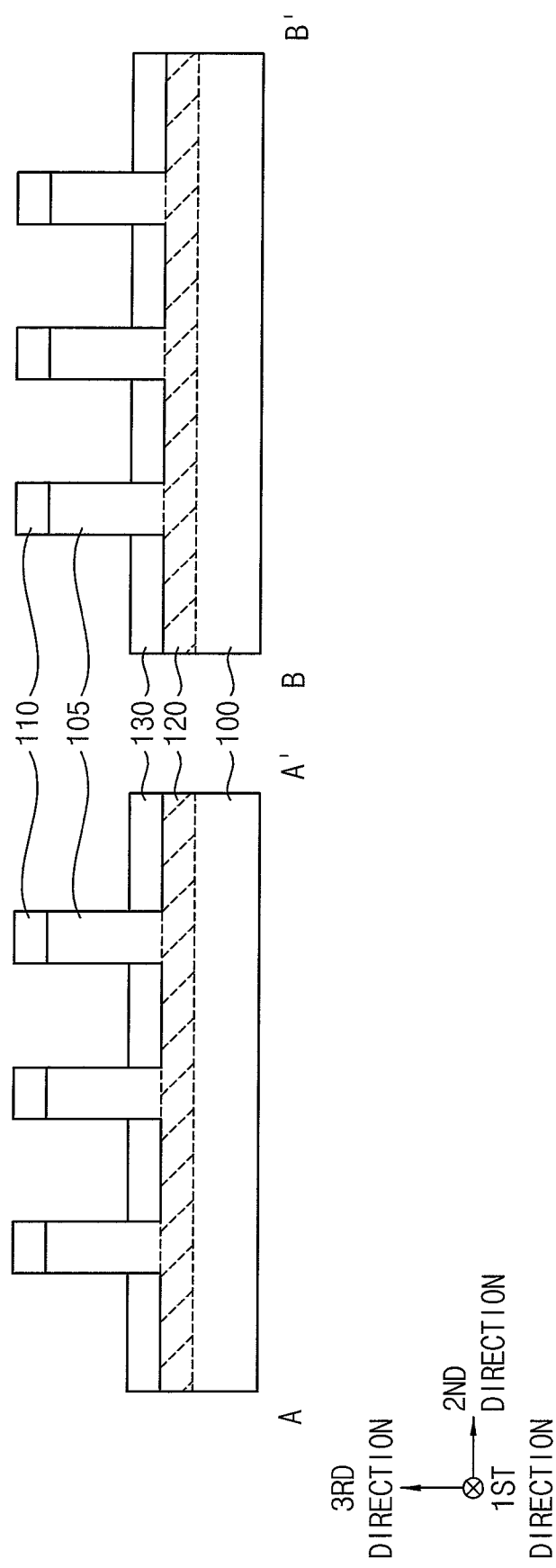

Referring to FIGS. 3 and 4, hard masks 110 may be formed on a substrate 100, and an upper portion of the substrate 100 may be etched using the hard masks 110 as an etching mask to form a plurality of semiconductor patterns 105, each of which may protrude from the substrate 100 upwardly in the third direction, spaced apart from each other.

In exemplary embodiments of the inventive concept, each of the hard masks 110 may extend in the first direction, and a plurality of hard masks 110 may be spaced apart from each other in the second direction. Thus, each of the semiconductor patterns 105 may extend in the first direction, and a plurality of semiconductor patterns 105 may be spaced apart from each other in the second direction. In FIGS. 3 to 11B, three hard masks 110 and three semiconductor patterns 105 are formed in the second direction, however, the inventive concept may not be limited thereto, and a plurality of hard masks 110 and a plurality of semiconductor patterns 105 may be formed. Each of the hard masks 110 may include a nitride, e.g., silicon nitride.

In an exemplary embodiment of the inventive concept, an ion implantation process may be performed into an upper portion of the substrate 100 to form a lower impurity region 120. The lower impurity region 120 may be formed at an entire upper portion of the substrate 100, or may be partially formed at an upper portion of the substrate 100 by a slant ion implantation process so that a plurality of lower impurity regions 120 may be formed to be spaced apart from each other.

A spacer layer may be formed on the substrate 100 having the semiconductor patterns 105 and the hard masks 110 thereon, and an upper portion of the spacer layer may be etched to form a spacer 130 covering a lower sidewall of each of the semiconductor patterns 105.

Figure 5:
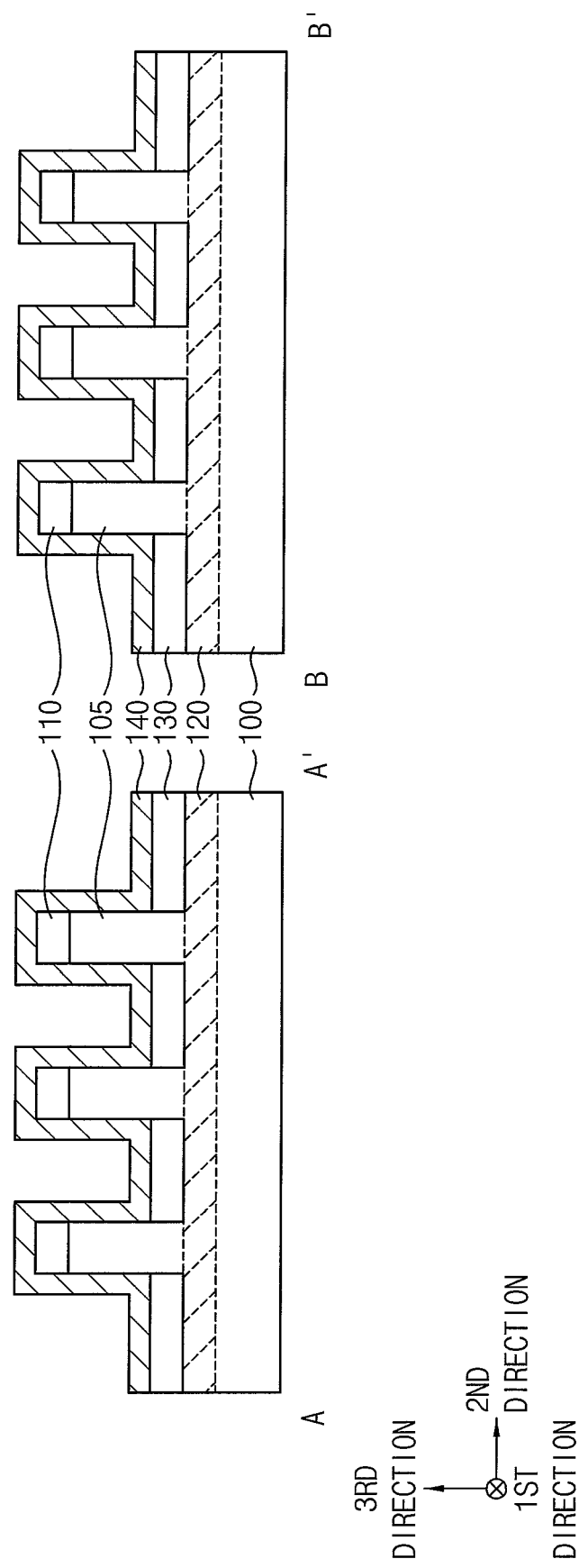

Referring to FIG. 5, a conductive layer 140 may be conformally formed on the spacer 130, the semiconductor patterns 105 and the hard masks 110.

Before forming the conductive layer 140, a first insulation layer including, e.g., silicon oxide, and/or a second insulation layer including, e.g., a metal oxide, may be further formed on the spacer 130, the semiconductor patterns 105 and the hard masks 110.

Figure 6:
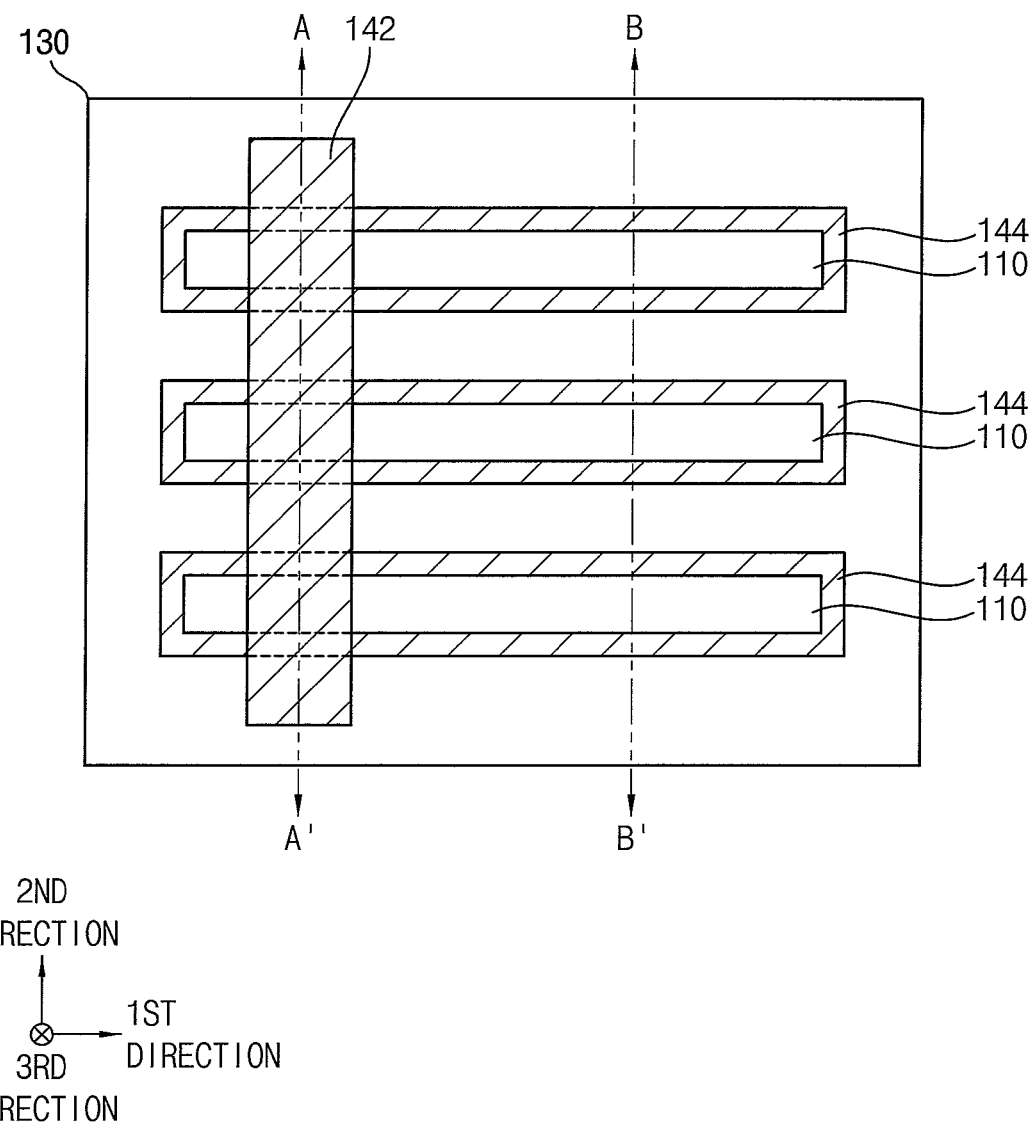
Figure 7:
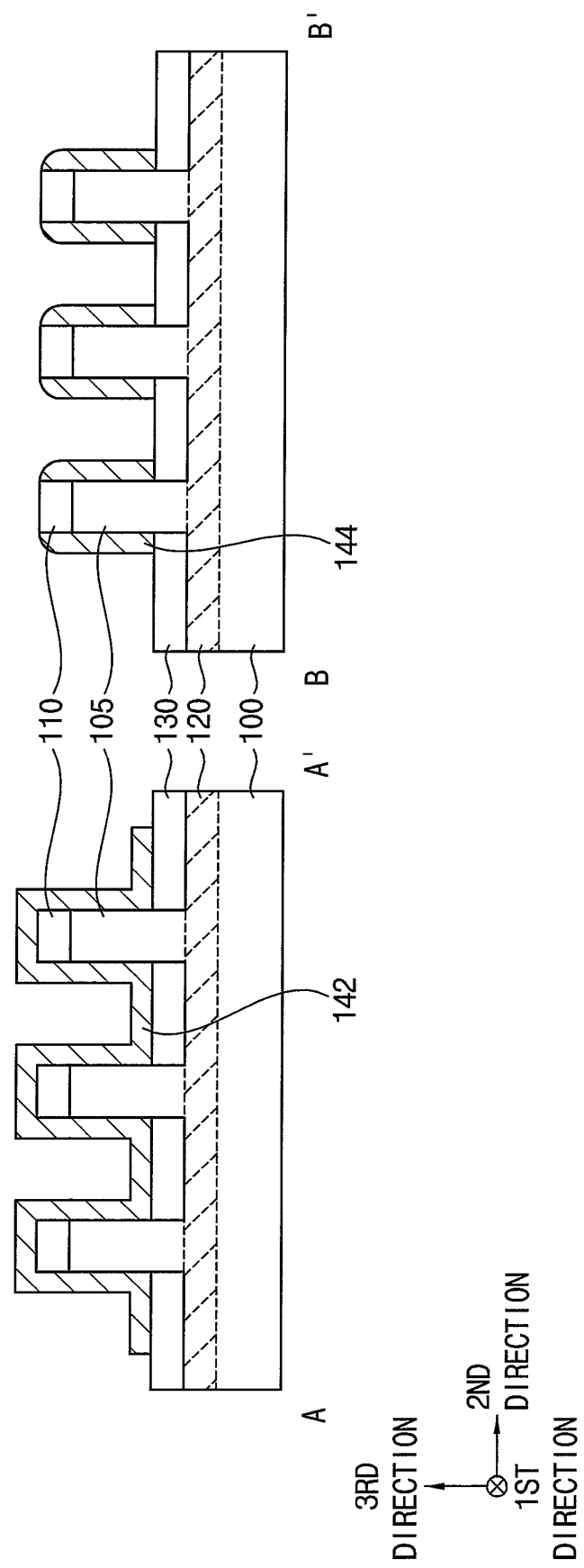

Referring to FIGS. 6 and 7, the conductive layer 140 may be etched using an etching mask.

In exemplary embodiments of the inventive concept, the etching mask may extend in the second direction to cover portions of the conductive layer 140 that are formed on the hard masks 110 and portions of the spacer 130 between the hard masks 110, and the etching process may be an anisotropic etching process.

Thus, in an area covered by the etching mask, the conductive layer 140 may remain not only on sidewalls of the semiconductor patterns 105 and the hard masks 110 but also on an upper surface of each of the hard masks 110, portions of the spacer 130 between the semiconductor patterns 105, and portions of the spacer 130 at outer sides of the semiconductor patterns 105 in the second direction to form a preliminary second conductive pattern 142 extending in the second direction. In an area not covered by the etching mask, the conductive layer 140 may remain only on sidewalls of the semiconductor patterns 105 and the hard masks 110 to form a first conductive pattern 144.

Accordingly, the first conductive pattern 144 surrounding the sidewalls of the semiconductor patterns 105 and the hard masks 110, and the preliminary second conductive pattern 142 extending in the second direction to cover the semiconductor patterns 105, the hard masks 110, and portions of the spacer 130 adjacent thereto may be formed.

Figure 8:
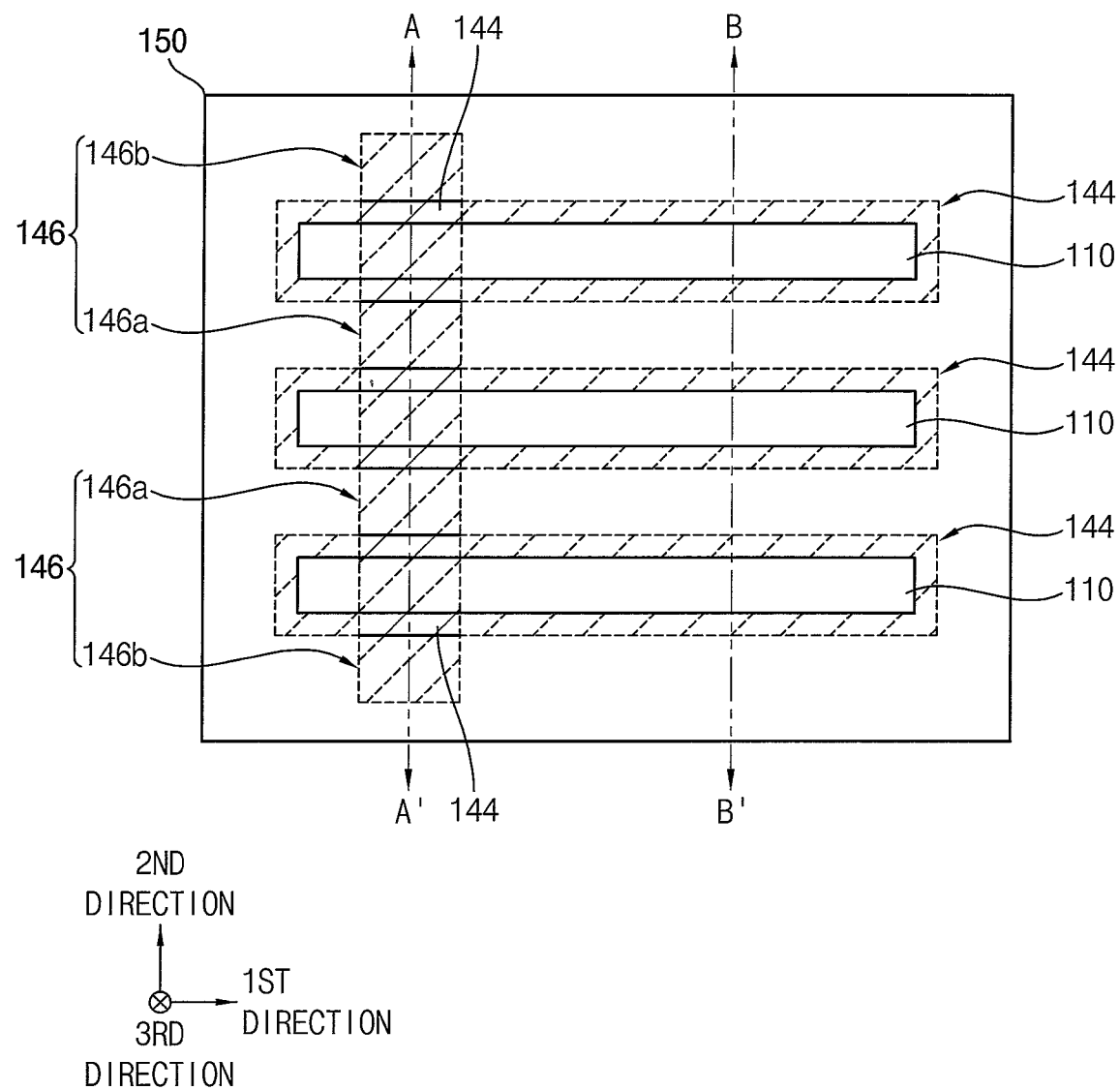
Figure 9:
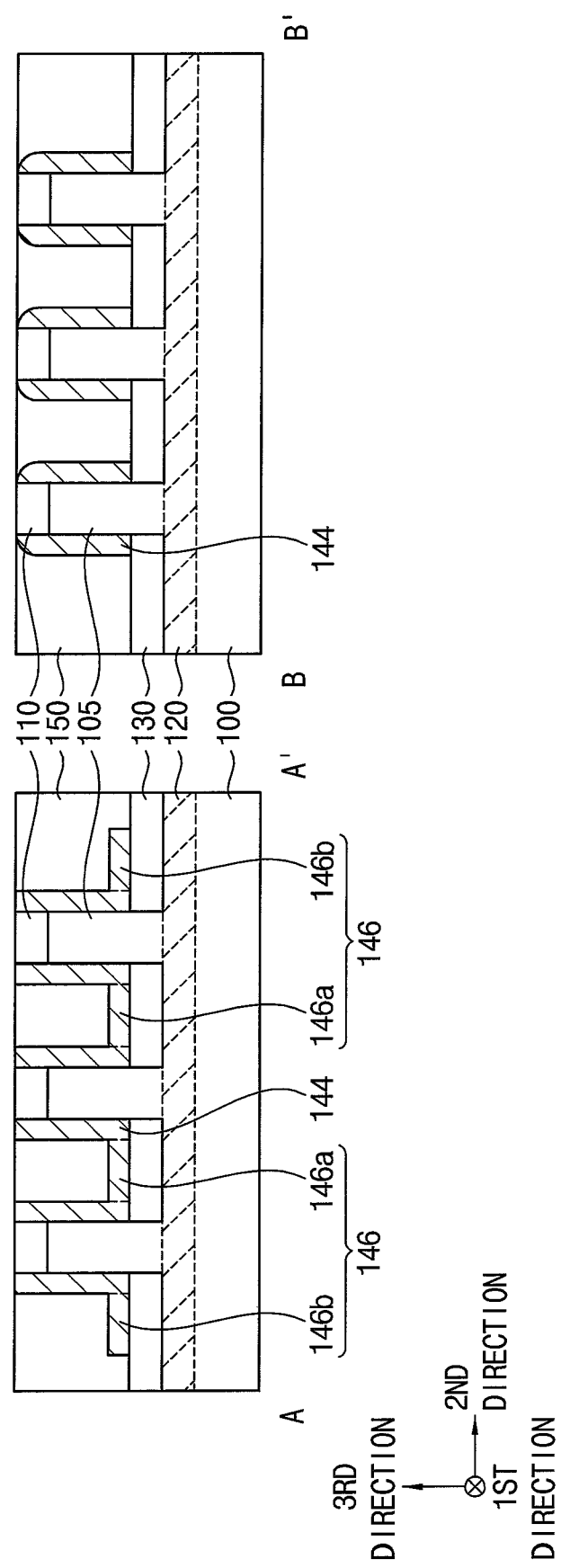

Referring to FIGS. 8 and 9, a first insulating interlayer 150 may be formed on the preliminary second conductive pattern 142, the first conductive pattern 144, the hard masks 110 and the spacer 130, and may be planarized until upper surfaces of the hard masks 110 may be exposed.

During the planarization process, portions of the preliminary second conductive pattern 142 on the hard masks 110 may be also removed, and thus the preliminary second conductive pattern 142 may remain on the sidewalls of the semiconductor patterns 105 and the hard masks 110 and a portion of the spacer 130. Hereinafter, portions of the preliminary second conductive pattern 142 on the sidewalls of the semiconductor patterns 105 and the hard masks 110 may be considered as a portion of the first conductive pattern 144 previously formed, and a remaining portion of the preliminary second conductive pattern 142, in other words, a portion of the preliminary second conductive pattern 142 on the portion of the spacer 130 not contacting the sidewalls of the semiconductor patterns 105 and the hard masks 110 but adjacent thereto may be referred to as a second conductive pattern 146.

Thus, the first conductive pattern 144 may entirely surround upper sidewalls of the semiconductor patterns 105 and the hard masks 110. Additionally, the second conductive pattern 146 may include a connection pattern 146a and a pad 146b, and may be connected to the first conductive pattern 144. The connection pattern 146a may be formed between the first conductive patterns 144 covering the upper sidewalls of the semiconductor patterns 105 spaced apart from each other in the second direction. The pad 146b may be formed on a portion of the spacer 130, which is located at opposite side of a group of the first conductive patterns 144 arranged in the second direction.

The first conductive pattern 144 may serve as a resistor. The connection pattern 146a of the second conductive pattern 146 may connect the first conductive patterns 144 with each other. For example, the connection pattern 146a may be disposed between and contact adjacent first conductive patterns 144. The pad 146b of the second conductive pattern 146 may also contact a contact plug 180 (refer to FIGS. 1 and 2) subsequently formed to be electrically connected thereto.

Figure 11A:
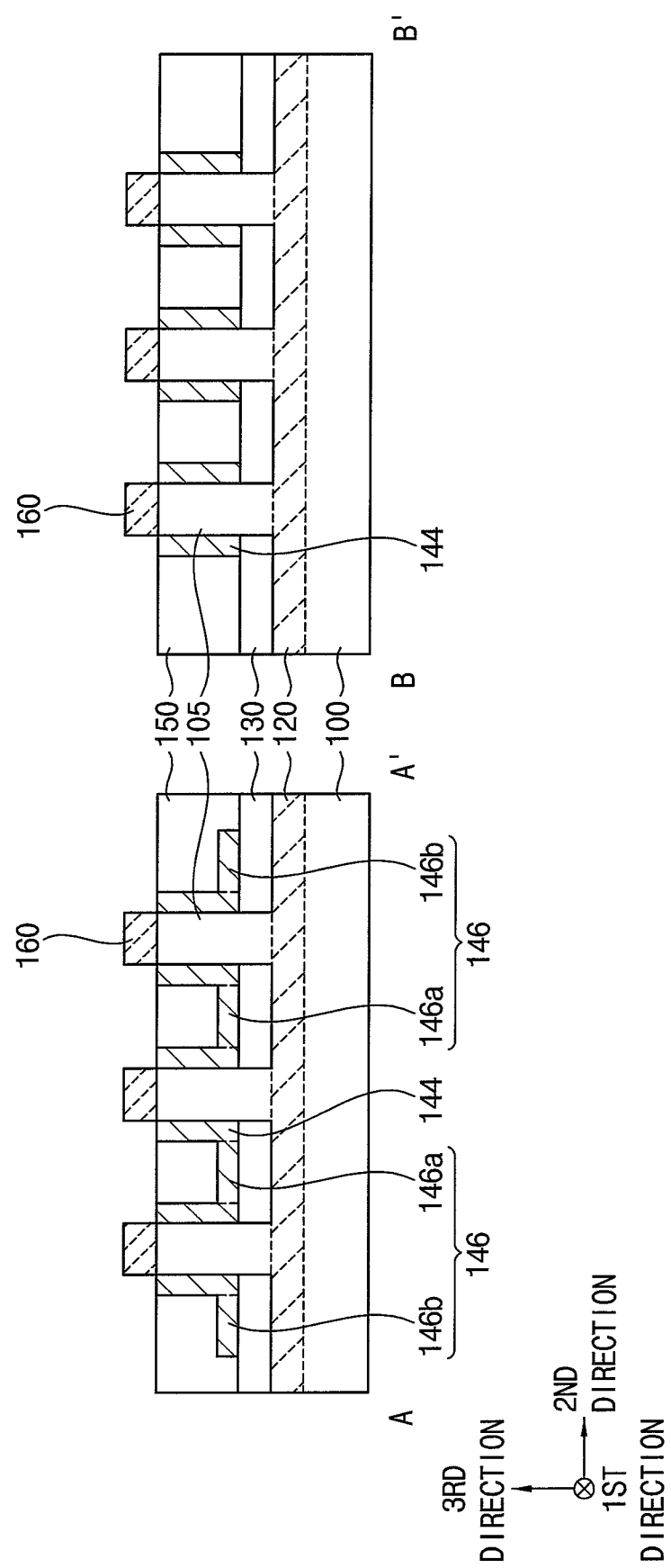
Figure 11B:
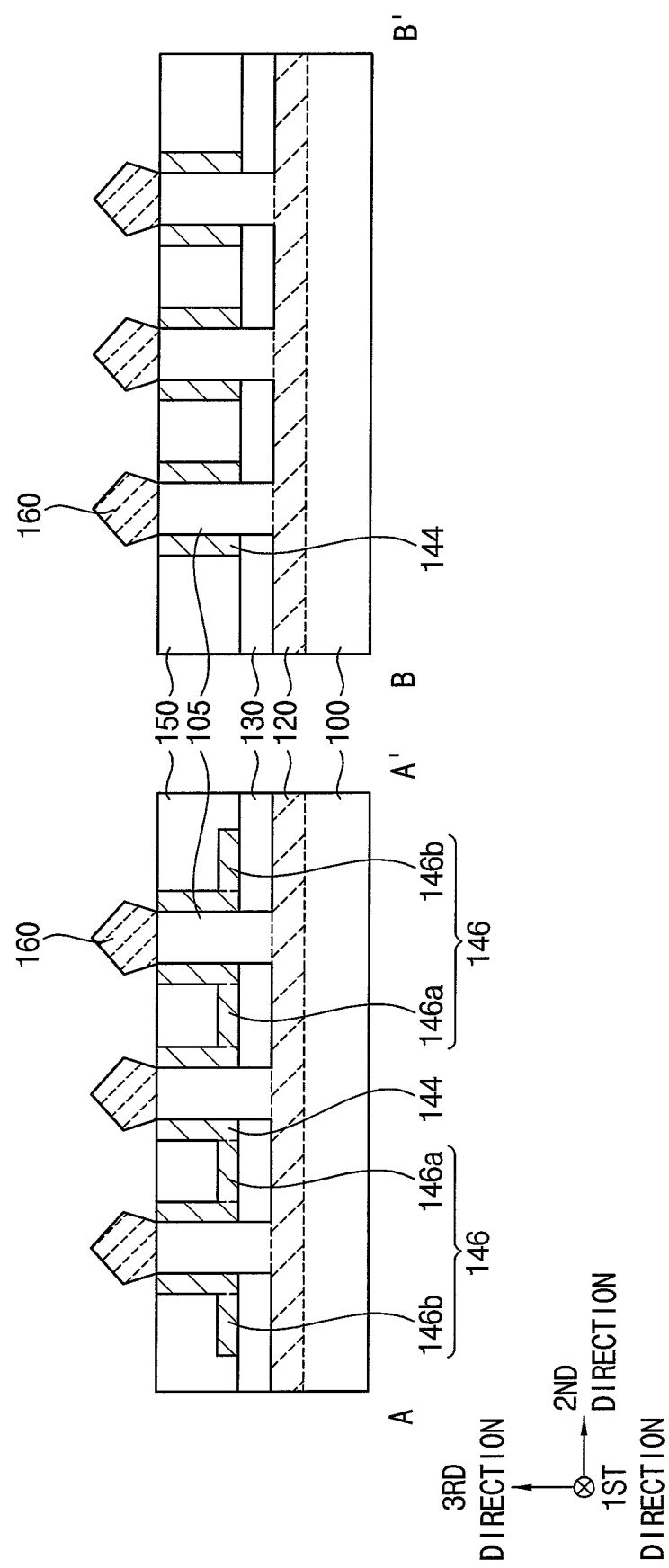

Referring to FIGS. 10 and 11A, an upper portion of the first insulating interlayer 150 may be removed to form a recess exposing an upper portion of the first conductive pattern 144, the exposed upper portion of the first conductive pattern 144 may be removed to expose hard masks 110, and the exposed hard masks 110 may be removed.

In exemplary embodiments of the inventive concept, a bottom of the recess may be lower than upper surfaces of the semiconductor patterns 105, and as the upper portions of the first insulating interlayer 150 and the first conductive pattern 144 are removed, upper portions of the semiconductor patterns 105 may be exposed.

For example, an ion implantation process may be performed on the exposed upper portions of the semiconductor patterns 105 to form upper impurity regions 160, respectively. In exemplary embodiments of the inventive concept, the upper impurity region 160 may include impurities having the same conductivity type as the lower impurity region 120.

Alternatively, referring to FIG. 11B, after removing the exposed upper portions of the semiconductor patterns 105, a selective epitaxial growth (SEG) process may be performed using upper surfaces of the semiconductor patterns 105 as a seed to form the upper impurity region 160. In this case, the upper impurity region 160 may have a cross-section with a pentagon-like shape.

Referring to FIGS. 1 and 2 again, a second insulating interlayer 170 may be formed on the first insulating interlayer 150, the first conductive patterns 144 and the upper impurity regions 160, and the contact plugs 180 may be formed through the first and second insulating interlayers 150 and 170 to contact respective upper surfaces of the second conductive pattern 146.

In exemplary embodiments of the inventive concept, each of the contact plugs 180 may not be formed on the connection pattern 146a of the second conductive pattern 146, but may be formed on the pad 146b of the second conductive pattern 146.

The semiconductor device may be manufactured by the above processes. As illustrated above, the first conductive pattern 144 surrounding the upper sidewalls of the semiconductor patterns 105 may be formed, so that a resistor having a small horizontal area may be formed. More specifically, a resistor in the form of the first conductive pattern 144 that has a small horizontal area may be formed.

Additionally, the semiconductor device may have substantially the same structure as a vertical transistor illustrated subsequently, except for some elements, and thus may be formed by the same method. Accordingly, additional processes for forming the resistor are not needed so as to decrease process time and cost.

The first conductive patterns 144 may be connected with each other in series through the connection pattern 146a of the second conductive pattern 146, and thus a desired specific resistivity may be easily obtained for the resistor.

Figure 12:
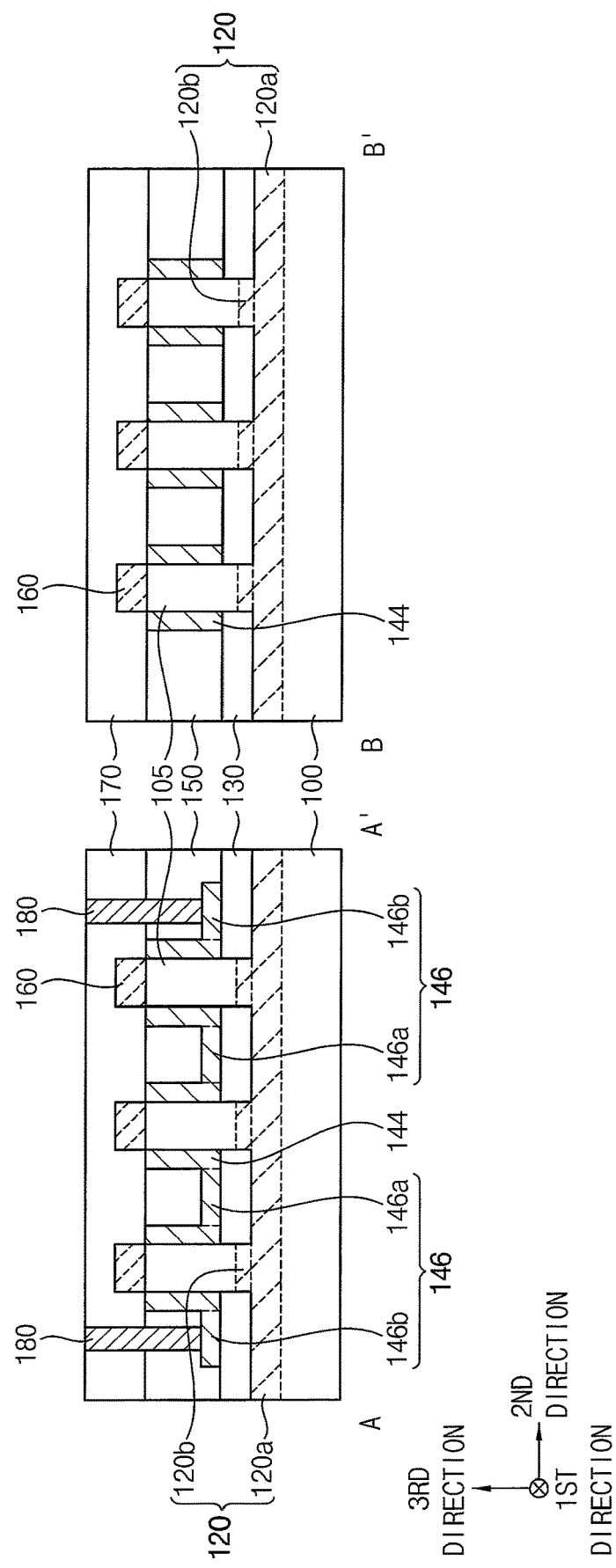
FIG. 12 is a cross-sectional view illustrating a semiconductor device in accordance with exemplary embodiments of the inventive concept.

FIG. 12 is a cross-sectional view illustrating a semiconductor device in accordance with exemplary embodiments of the inventive concept. FIG. 12 includes cross-sections taken along the lines A-A' and B-B', respectively, of FIG. 1.

This semiconductor device may be substantially the same as that of FIGS. 1 and 2, except for the lower impurity region 120. Thus, like reference numerals refer to like elements, and repetitive descriptions thereon are omitted.

Referring to FIG. 12, the lower impurity region 120 may include a base portion 120a and a protrusion portion 120b.

The base portion 120a of the lower impurity region 120 may be formed at an upper portion of the substrate 100, and may be formed at an entire upper portion of the substrate 100 or may extend in at least one direction, for example, in the second direction.

The protrusion portion 120b of the lower impurity region 120 may protrude from the base portion 120a upwardly in the third direction, and may contact a bottom surface of the semiconductor pattern 105. Thus, the protrusion portion 120b of the lower impurity region 120 may extend in the first direction, and a plurality of protrusion portions 120b may be spaced apart from each other in the second direction.

The base portion 120a and the protrusion portion 120b of the lower impurity region 120 may include substantially the same impurities.

The lower impurity region 120 may be formed by following processes.

An SEG process may be performed using an upper surface of the substrate 100 as a seed to form an impurity layer, a semiconductor layer may be formed on the impurity layer by an SEG process, the hard masks 110 may be formed on the semiconductor layer, and the semiconductor layer and an upper portion of the impurity layer may be etched using the hard masks 110 as an etching mask to form the semiconductor patterns 105, and to form the protrusion portions 120b of the lower impurity region 120 contacting a bottom surface of each of the semiconductor patterns 105. Each of the semiconductor patterns 105 may protrude from the substrate 100 upwardly in the third direction and be spaced apart from each other. A lower portion of the impurity layer not etched during the etching process may remain as the base portion 120a of the lower impurity region 120.

Figure 13:
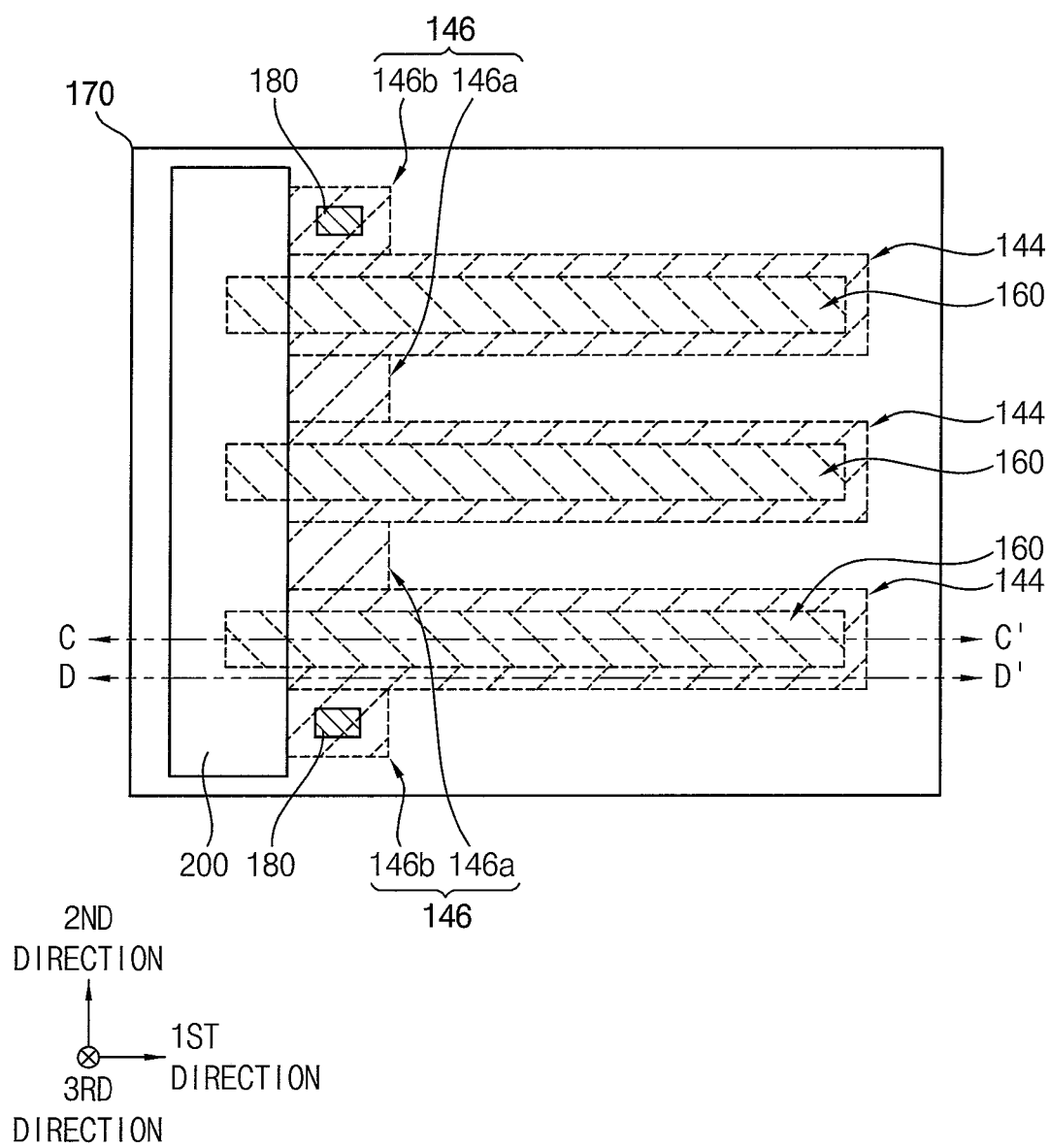
FIGS. 13 and 14 are a plan view and a cross-sectional view, respectively, illustrating a semiconductor device in accordance with exemplary embodiments of the inventive concept.
Figure 14:
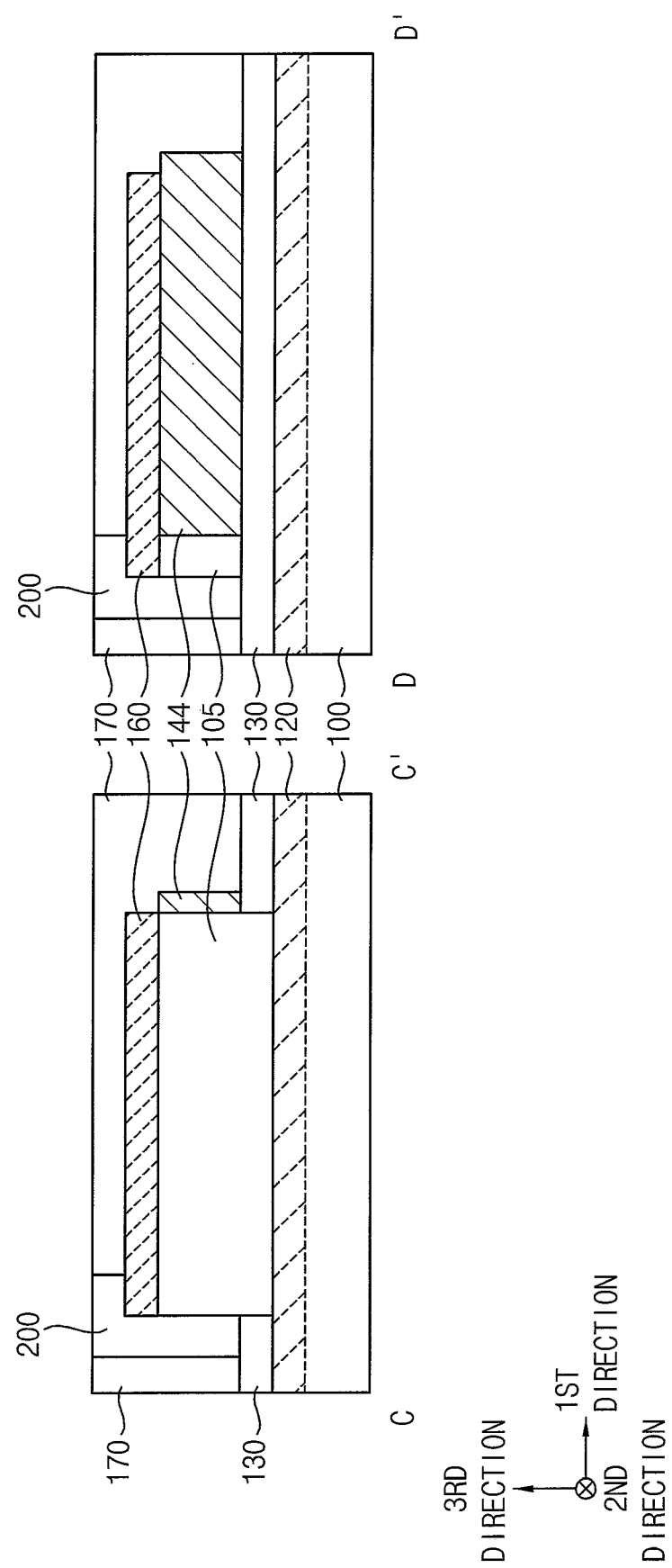

FIGS. 13 and 14 are a plan view and a cross-sectional view, respectively, illustrating a semiconductor device in accordance with exemplary embodiments of the inventive concept. FIG. 14 includes cross-sections taken along lines C-C' and D-D', respectively, of FIG. 13.

This semiconductor device may be substantially the same as that of FIGS. 1 and 2, except for the first conductive pattern 144. Thus, like reference numerals refer to like elements, and repetitive descriptions thereon are omitted.

Referring to FIGS. 13 and 14, the first conductive pattern 144 may not cover the entire upper sidewall of each of the semiconductor patterns 105, and a portion of each of the semiconductor patterns 105 not covered by the first conductive pattern 144 and a portion of the upper impurity region 160 thereon may be covered by a third insulating interlayer 200.

In exemplary embodiments of the inventive concept, a sidewall of a first end of opposite ends in the first direction of each of the semiconductor patterns 105 may be covered by the first conductive pattern 144, however, a sidewall of a second end of the opposite ends may not be covered by the first conductive pattern 144. In exemplary embodiments of the inventive concept, a sidewall of a portion of the first conductive pattern 144 may be aligned along the second direction with a sidewall of the second conductive pattern 146.

Thus, in FIGS. 1 and 2, portions of the first conductive pattern 144 at opposite sides in the first direction of the pad 146b of the second conductive pattern 146 may serve as a resistor, while in FIGS. 13 and 14, only a portion of the first conductive pattern 144 at one side in the first direction of the pad 146b of the second conductive pattern 146 may serve as a resistor.

The third insulating interlayer 200 may include substantially the same material as the second insulating interlayer 170.

Figure 15:
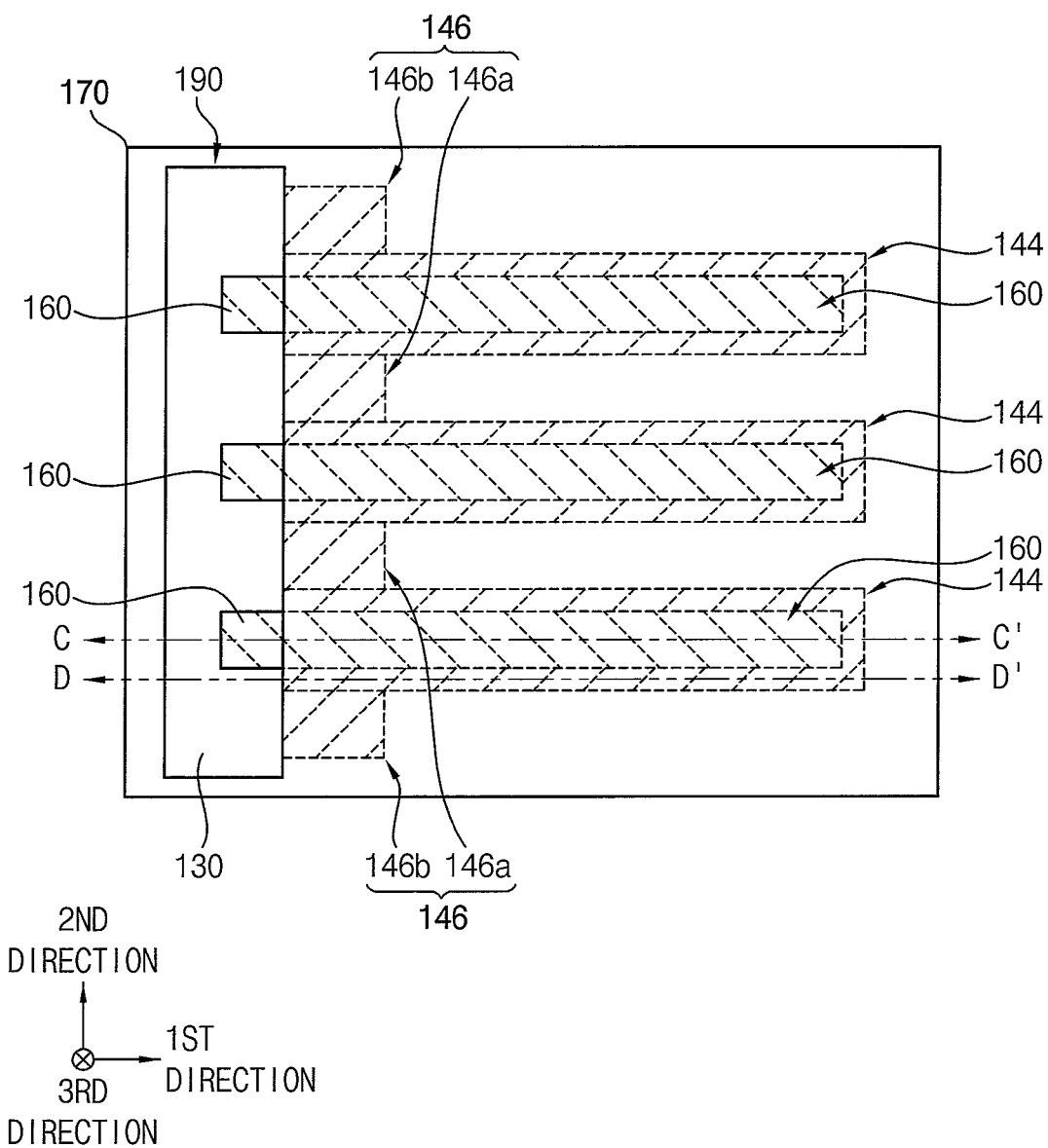
FIGS. 15 and 16 are a plan view and a cross-sectional view, respectively, illustrating a method of manufacturing a semiconductor device in accordance with exemplary embodiments of the inventive concept.
Figure 16:
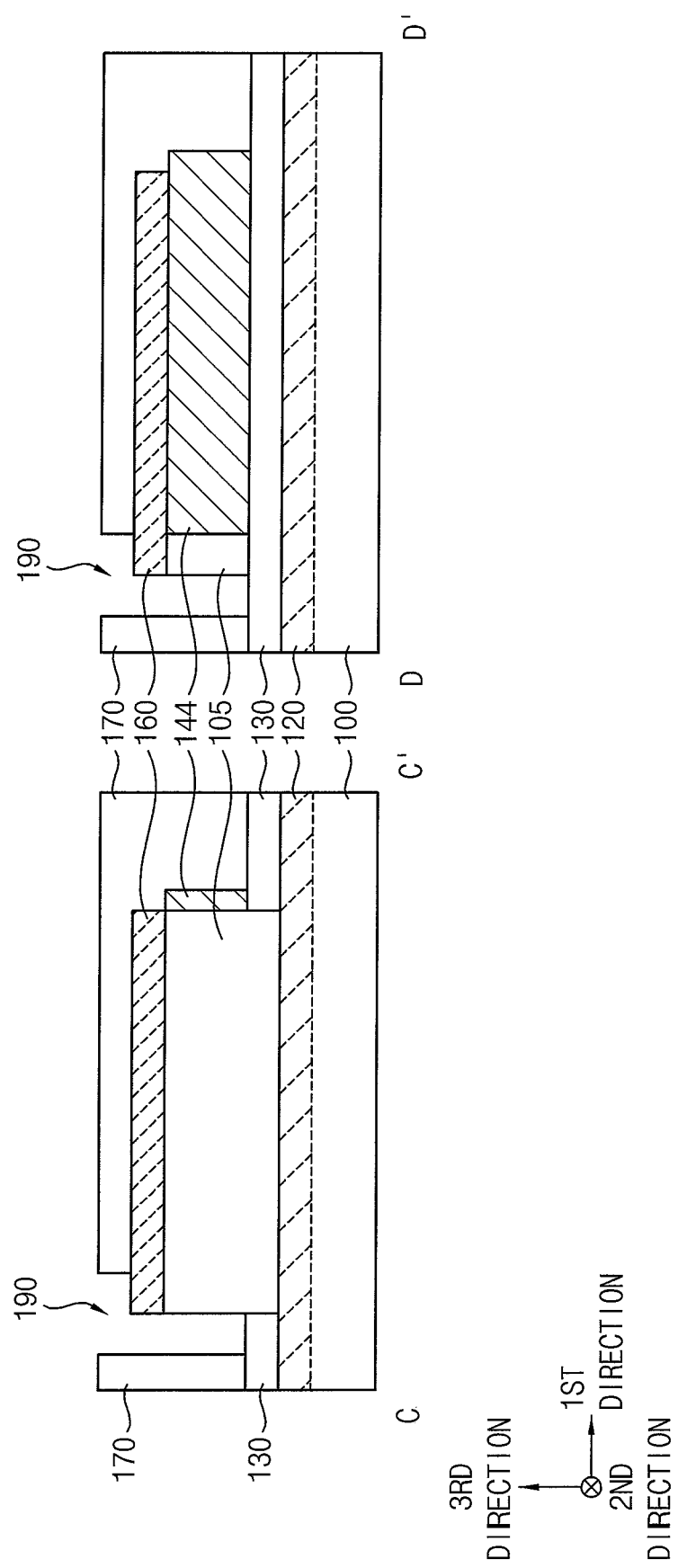

FIGS. 15 and 16 are a plan view and a cross-sectional view, respectively, illustrating a method of manufacturing a semiconductor device in accordance with exemplary embodiments of the inventive concept. FIG. 16 includes cross-sections taken along lines C-C' and D-D', respectively, of FIG. 15.

This method may include processes substantially the same as or similar to those illustrated with reference to FIGS. 3 to 11 and FIGS. 1 and 2, and thus repetitive descriptions thereon are omitted.

Referring to FIGS. 15 and 16, processes substantially the same as or similar to those illustrated with reference to FIGS. 3 to 11 may be performed, and the second insulating interlayer 170 may be formed.

A portion of the second insulating interlayer 170 may be etched to form an opening 190 exposing a portion of the first conductive pattern 144 covering a sidewall of an end in the first direction of each of the semiconductor patterns 105, and the exposed portion of the first conductive pattern 144 may be removed by an etching process.

In exemplary embodiments of the inventive concept, the opening 190 may extend in the second direction, and thus portions of the first conductive patterns 144 covering sidewalls of the semiconductor patterns 105 spaced apart from each other in the second direction may be exposed to be removed. In exemplary embodiments of the inventive concept, a sidewall of the opening 190 may be aligned with a sidewall of the second conductive pattern 146 along the second direction, and thus by the etching process, a sidewall of the first conductive pattern 144 and a sidewall of the second conductive pattern 146 may be aligned with each other along the first direction.

Alternatively, a sidewall of the opening 190 may be closer to a central portion of each of the semiconductor patterns 105 in the first direction than to a sidewall of the second conductive pattern 146 in the first direction, and thus not only the first conductive pattern 144 but also a portion of the second conductive pattern 146 may be removed by the etching process. However, as a result, a sidewall of the first conductive pattern 144 in the first direction may be also aligned with a sidewall of the second conductive pattern 146 in the first direction.

Referring to FIGS. 13 and 14 again, a third insulating interlayer 200 may be formed to fill the opening 190, and processes substantially the same as or similar to those illustrated with reference to FIGS. 1 and 2 may be performed to complete the fabrication of the semiconductor device.

FIGS. 17 to 19 are plan views illustrating layouts of semiconductor devices in accordance with exemplary embodiments of the inventive concept. These semiconductor devices may be substantially the same as that of FIGS. 1 and 2, except for the first conductive pattern 144 and/or the second conductive pattern 146. Thus, like reference numerals refer to like elements, and repetitive descriptions thereon are omitted.

In order to avoid complex drawings, the first and second insulating interlayers 150 and 170 are not shown in FIGS. 17 to 19.

Referring to FIG. 17, the semiconductor device may include a resistor that may be formed by one first conductive pattern 144 surrounding one semiconductor pattern 105, and thus there is no need for the connection pattern 146a of the second conductive pattern 146 that may connect the first conductive patterns 144 covering sidewalls of the semiconductor patterns 105, respectively.

In an exemplary embodiment of the inventive concept, the pads 146b of the second conductive pattern 146 for contacting the contact plug 180 may be formed at opposite end portions, respectively, in the first direction of a same side in the second direction of the semiconductor pattern 105. Alternatively, the pads 146b of the second conductive pattern 146 for contacting the contact plug 180 may be formed at opposite end portions, respectively, in the first direction of opposite sides in the second direction of the semiconductor pattern 105.

Referring to FIG. 18, the connection patterns 146a and the pads 146b of the second conductive pattern 146 may be aligned with each other in the second direction at central portions in the first direction of the semiconductor patterns 105.

Thus, in the semiconductor device of FIGS. 1 and 2, portions of the first conductive pattern 144 having different lengths in the first direction at opposite sides in the first direction of the pad 146b of the second conductive pattern 146 may form a resistor, while in the semiconductor device of FIG. 18, portions of the first conductive pattern 144 having the same length in the first direction at opposite sides in the first direction of the pad 146b of the second conductive pattern 146 may form a resistor.

Referring to FIG. 19, the connection patterns 146a and the pads 146b of the second conductive pattern 146 may be arranged in a zigzag pattern in the second direction.

As illustrated above, by changing positions of the connection patterns 146a of the second conductive pattern 146 for connecting the first conductive patterns 144 serving as resistors and surrounding the upper sidewalls of the semiconductor patterns 105, the resistor having a desired specific resistivity may be easily formed.

Figure 20:
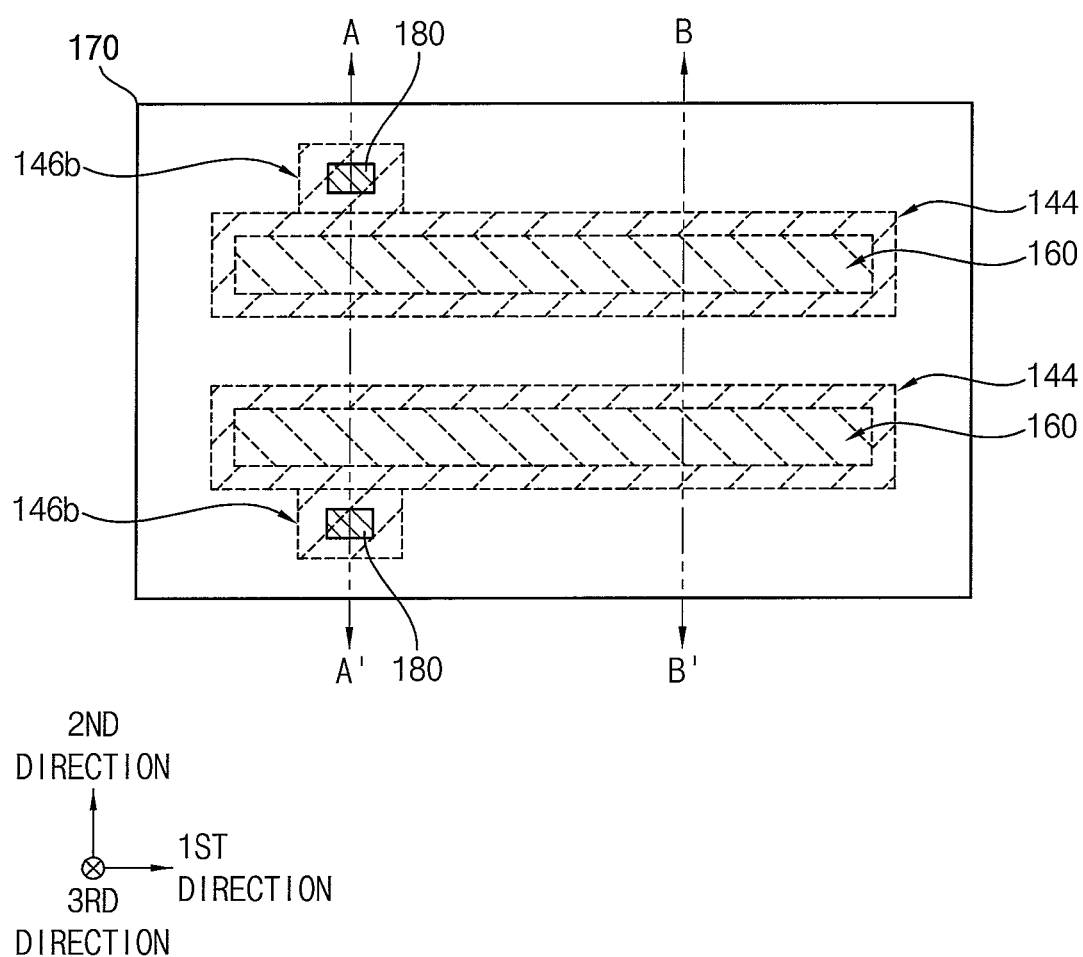
FIGS. 20 and 21 are a plan view and a cross-sectional view, respectively, illustrating a semiconductor device in accordance with exemplary embodiments of the inventive concept.
Figure 21:
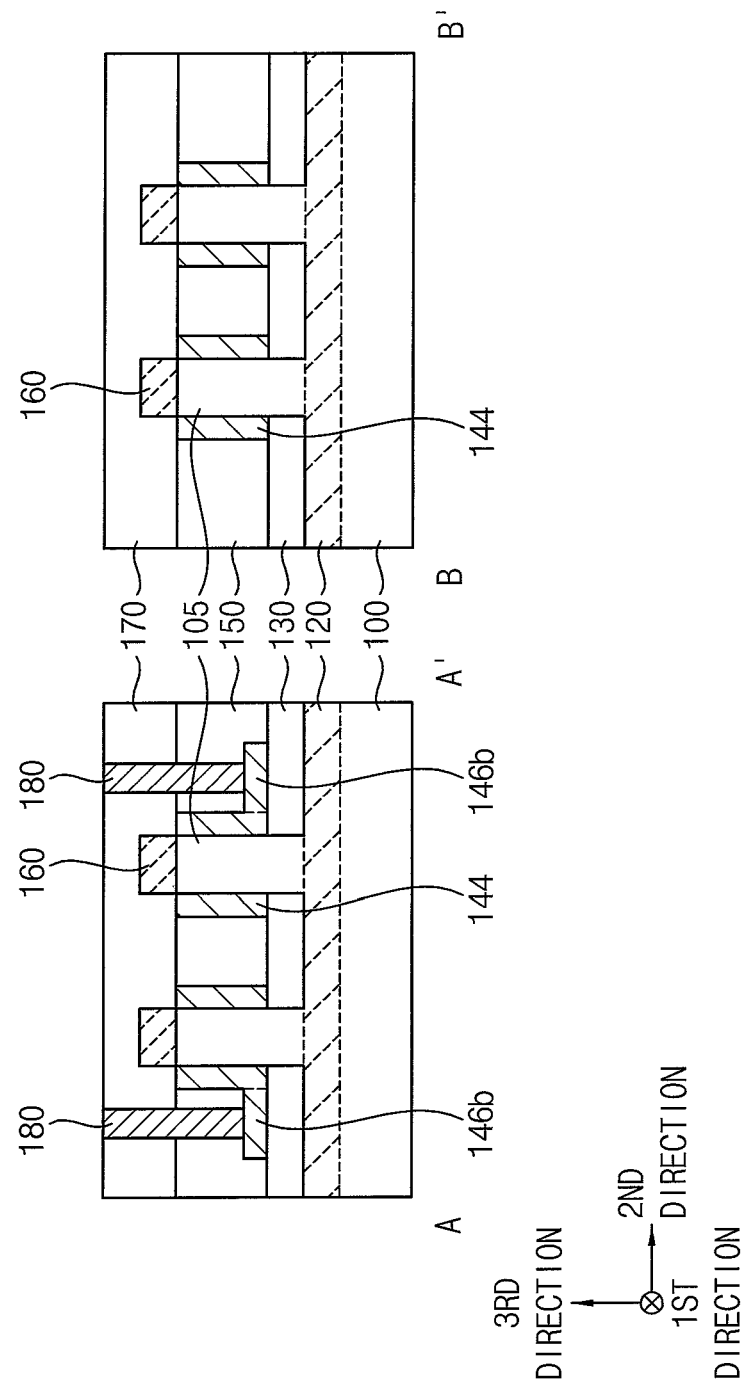

FIGS. 20 and 21 are a plan view and a cross-sectional view, respectively, illustrating a semiconductor device in accordance with exemplary embodiments of the inventive concept. FIG. 21 includes cross-sections taken along lines A-A' and B-B' of FIG. 20.

This semiconductor device may be substantially the same as or similar to that of FIGS. 1 and 2, except for the second conductive pattern 146. Thus, like reference numerals refer to like elements, and repetitive descriptions thereon are omitted.

Referring to FIGS. 20 and 21, the semiconductor device may not include the connection pattern 146a of the second conductive pattern 146, and may include only the pad 146b of the second conductive pattern 146. In other words, the connection pattern 146a may not be provided between a pair of first conductive patterns 144.

Thus, the first insulating interlayer 150 may be formed between a pair of first conductive patterns 144 covering upper sidewalls of a pair of semiconductor patterns 105, respectively, spaced apart from each other in the second direction, and the pair of first conductive patterns 144 and the first insulating interlayer 150 may serve as a capacitor. The capacitor may have a capacitance that may be changed depending on an area of the first conductive patterns 144 serving as electrodes of the capacitor, which may be opposite to each other in the second direction, and a dielectric constant of a material of the first insulating interlayer 150 serving as a dielectric layer of the capacitor.

Unlike a conventional capacitor having a large horizontal area on the substrate 100, the capacitor in accordance with exemplary embodiments of the inventive concept may include the first conductive patterns 144 covering the upper sidewalls of the semiconductor patterns 105 protruding in the vertical direction and the first insulating interlayer 150 therebetween, so as to have a reduced horizontal area.

The semiconductor device including the capacitor may have the same structure as a vertical transistor illustrated subsequently, except for some elements, and thus may be manufactured by the same method. Thus, additional processes for forming the transistor are not needed, so that process time and cost may be decreased.

Figure 22:
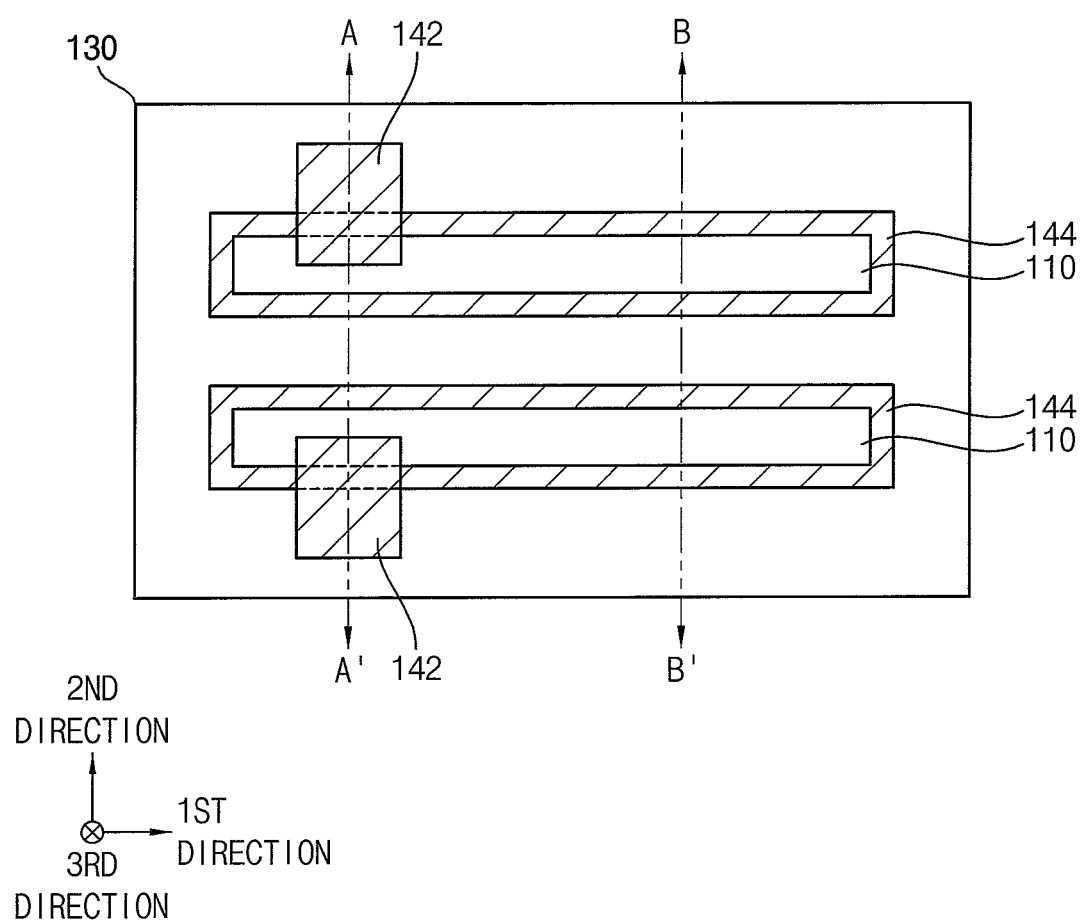
FIGS. 22 and 23 are a plan view and a cross-sectional view, respectively, illustrating a method of manufacturing a semiconductor device in accordance with exemplary embodiments of the inventive concept.
Figure 23:
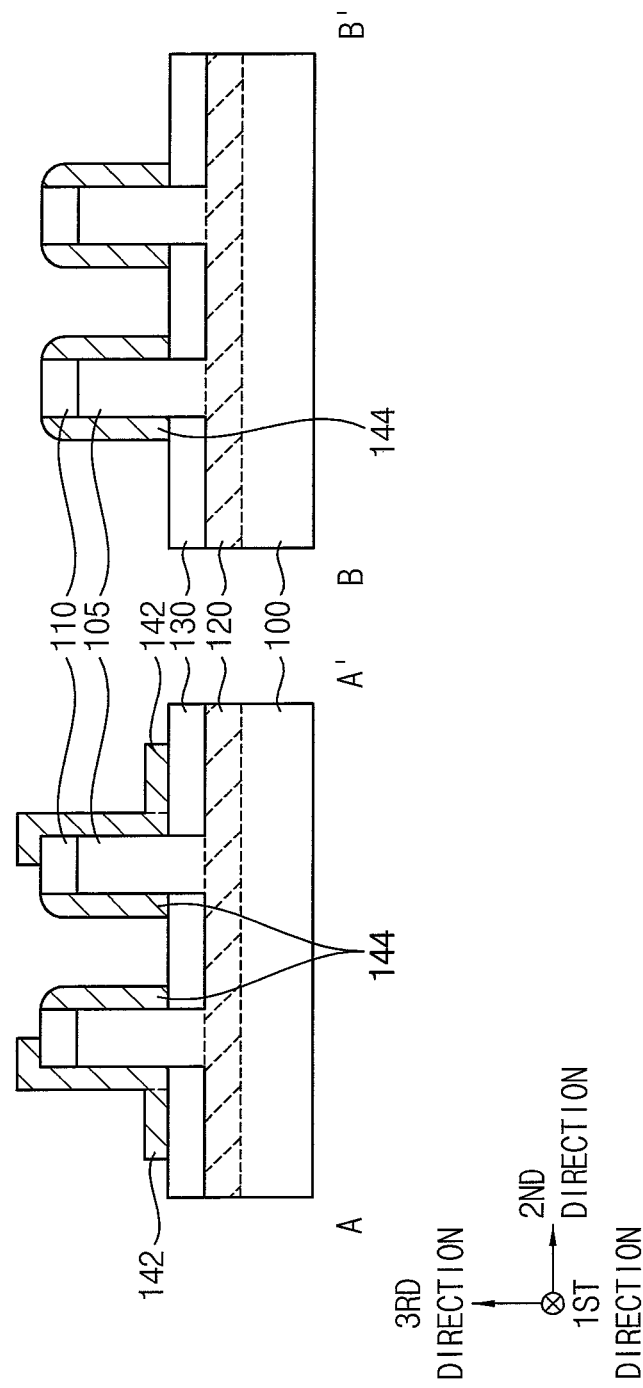

FIGS. 22 and 23 are a plan view and a cross-sectional view, respectively, illustrating a method of manufacturing a semiconductor device in accordance with exemplary embodiments of the inventive concept. FIG. 23 includes cross-sections taken along lines A-A' and B-B' of FIG. 22.

This method may include processes substantially the same as or similar to those illustrated with reference to FIGS. 3 to 11 and FIGS. 1 and 2, and thus repetitive explanations are omitted.

Referring to FIGS. 22 and 23, processes substantially the same as or similar to those illustrated with reference to FIGS. 3 to 7 may be performed.

However, only a pair of semiconductor patterns 105 may be formed to be spaced apart from each other in the second direction, and a pair of hard masks 110 may be formed to be spaced apart from each other in the second direction. A pair of etching masks may be spaced apart from each other such that each of the etching masks may cover a portion of the conductive layer 140 on sidewalls in the second direction of one of the semiconductor patterns 105 and a corresponding one of the hard masks 110 and an outside area in the second direction of the sidewalls thereof.

Thus, the conductive layer 140 may be etched using the pair of etching masks so that the conductive layer 140 may remain in an area covered by the pair of etching masks not only on the sidewalls of each of the semiconductor patterns 105 and each of the hard masks 110 but also on a portion of an upper surface of each of the hard masks 110 and on a portion of the spacer 130 in an outside area in the second direction of each of the semiconductor patterns 105 to form a pair of preliminary second conductive patterns 142 spaced apart from each other in the second direction. In an area not covered by the pair of etching masks, the conductive layer 140 may remain only on the sidewalls of each of the semiconductor patterns 105 and each of the hard masks 110 to form the first conductive pattern 144.

Processes substantially the same as or similar to those illustrated with reference to FIGS. 8 to 11 and FIGS. 1 and 2 may be performed to complete the fabrication of the semiconductor device.

As illustrated above, the capacitor may be formed by forming the pair of first conductive patterns 144 surrounding the upper sidewalls of the semiconductor patterns 105, respectively, and facing each other in the second direction, and forming the first insulating interlayer 150 therebetween. This way, the capacitor may have a small horizontal area. Particularly, the contact plugs 180 for transferring a voltage to the capacitor may not be formed on the first conductive pattern 144 but on the pad 146b of the second conductive pattern 146, and thus during the etching process for forming the contact plugs 180, the first conductive pattern 144 serving as the electrode of the capacitor may not be damaged. Accordingly, the capacitor may have improved electrical characteristics.

The semiconductor device may have the same structure as a vertical transistor illustrated subsequently, except for some elements, and thus may be formed by the same method. Accordingly, additional processes for forming the capacitor are not needed so as to decrease process time and cost.

Figure 25:
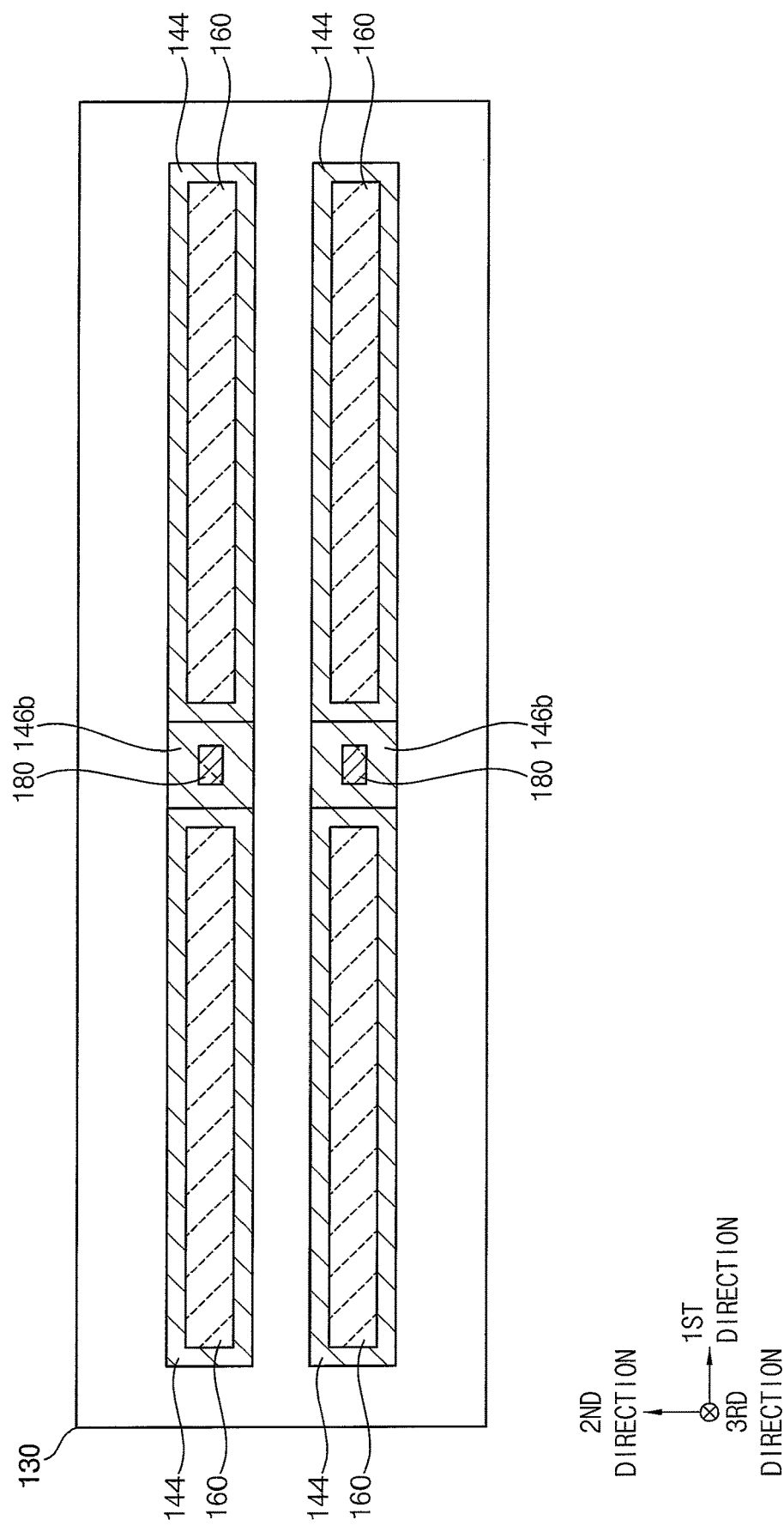
Figure 26:
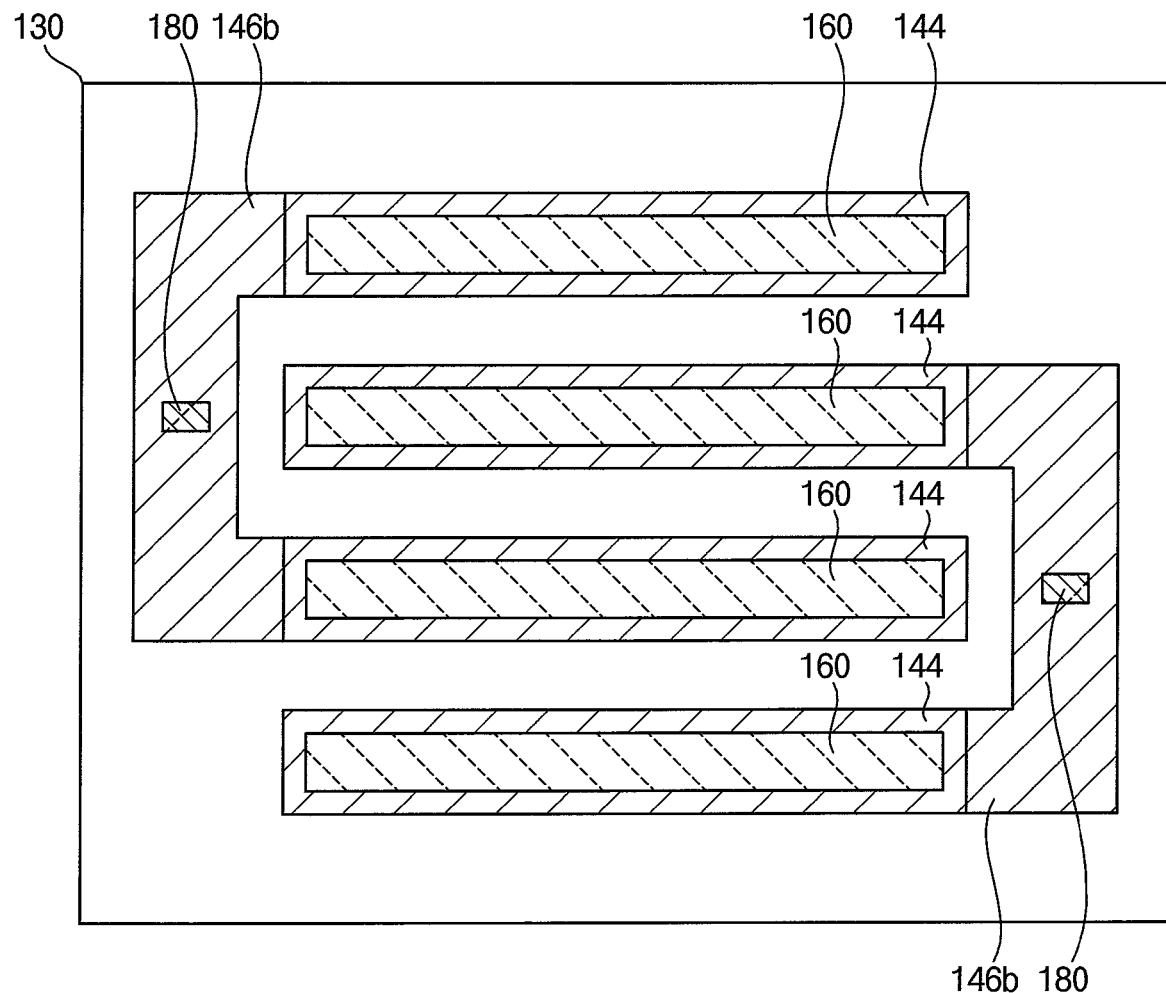

FIGS. 24 to 26 are plan views illustrating layouts of semiconductor devices in accordance with exemplary embodiments of the inventive concept. These semiconductor devices may be substantially the same as that of FIGS. 20 and 21, except for the first conductive pattern 144 and/or the second conductive pattern 146. Thus, like reference numerals refer to like elements, and repetitive descriptions thereon are omitted.

In order to avoid complex drawings, the first and second insulating interlayers 150 and 170 are not shown in FIGS. 24 to 26.

Referring to FIG. 24, the pad 146b of each of the second conductive patterns 146 for contacting the contact plug 180 may contact an end portion of the first conductive pattern 144 in the first direction, wherein the first conductive pattern surrounds a sidewall of the semiconductor pattern 105 extending in the first direction.

In FIG. 24, the pads 146b of the second conductive patterns 146 are aligned in the second direction, however, the inventive concept may not be limited thereto. Thus, the pads 146b of the second conductive patterns 146 may be formed at respective end portions of the first conductive patterns 144 such that the pads 146b may cross or overlap each other in the second direction.

Referring to FIG. 25, the semiconductor device may include a first pair of semiconductor patterns including the semiconductor patterns 105, respectively, each extending in the first direction and being spaced apart from each other in the first direction. The semiconductor device may also include a second pair of semiconductor patterns spaced apart from the first pair of semiconductor patterns in the second direction, which may include the semiconductor patterns 105, respectively, each extending in the first direction and being spaced apart from each other in the first direction.

In exemplary embodiments of the inventive concept, one of the pads 146b of the second conductive pattern 146 may be formed between end portions in the first direction of the first conductive patterns 144, in the first pair of semiconductor patterns. Another one of the pads 146b of the second conductive pattern 146 may be formed between end portions in the first direction of the first conductive patterns 144, in the second pair of semiconductor patterns. In other words, the semiconductor pattern 105 surrounded by the first conductive pattern 144 may be formed at each of opposite sides in the first direction of each pad 146b of the second conductive pattern 146.

Referring to FIG. 26, the semiconductor device may include a plurality of semiconductor patterns 105 spaced apart from each other in the second direction, and in FIG. 26, four semiconductor patterns 105 are shown.

In exemplary embodiments of the inventive concept, a first pad among the pads 146b of the second conductive pattern 146 may connect end portions of the first conductive patterns 144 surrounding sidewalls of odd-numbered ones of the plurality of semiconductor patterns 105. A second pad among the pads 146b of the second conductive pattern 146 may connect end portions of the first conductive patterns 144 surrounding sidewalls of even-numbered ones of the plurality of semiconductor patterns 105. The contact plugs 180 may be formed on the first and second pads, respectively. Thus, the pads 146b of the second conductive pattern 146 and the first conductive patterns 144 connected thereto may have a comb-like shape in a plan view.

As illustrated above, by changing locations of the pads 146b of the second conductive pattern 146 for transferring a voltage to the first conductive patterns 144, which may serve as electrodes of a capacitor and surround the sidewalls of the semiconductor patterns 105, respectively, the capacitor may have a desired capacitance.

Figure 27:
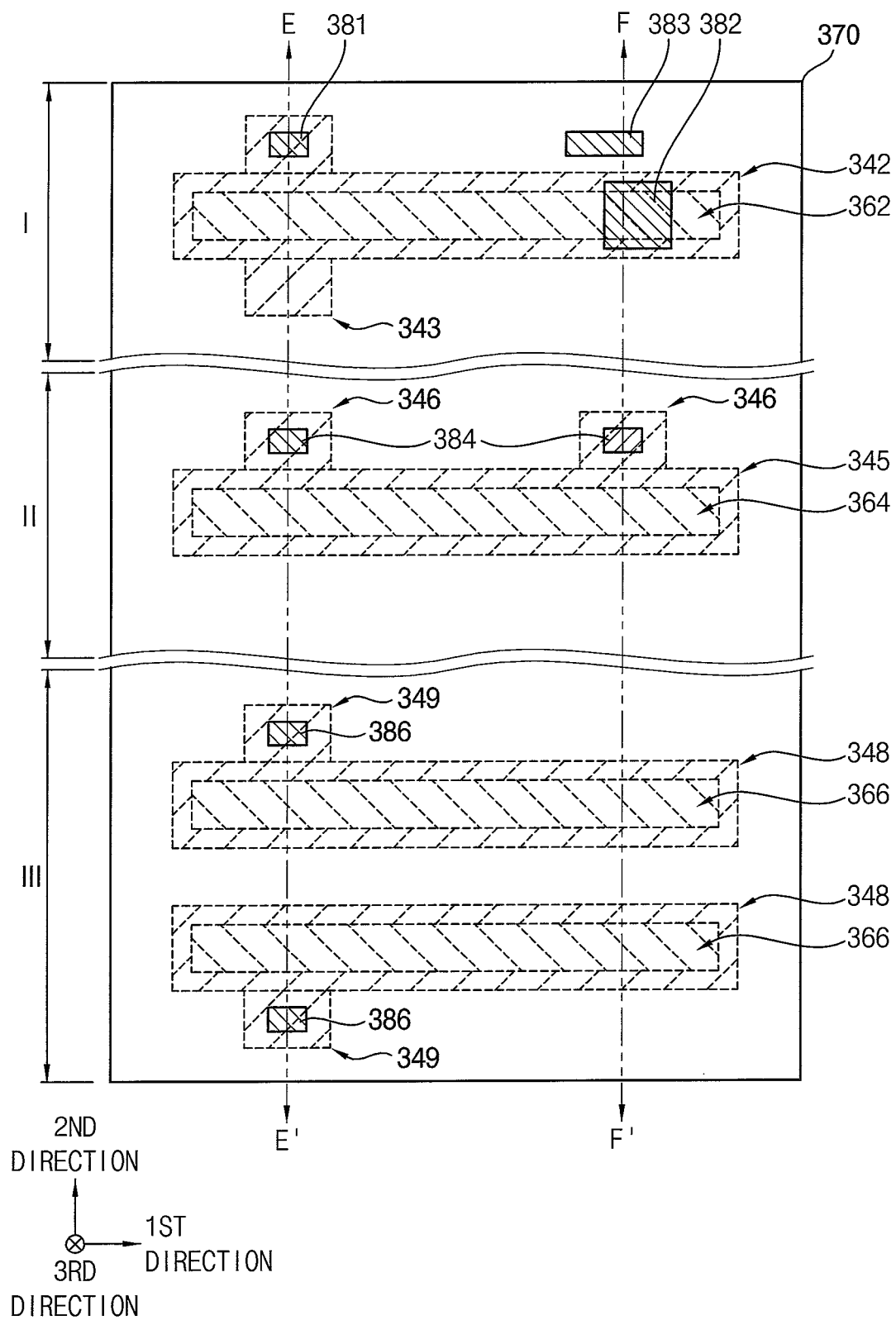
FIGS. 27, 28 and 29 are a plan view and cross-sectional views illustrating a semiconductor device in accordance with exemplary embodiments of the inventive concept.
Figure 28:
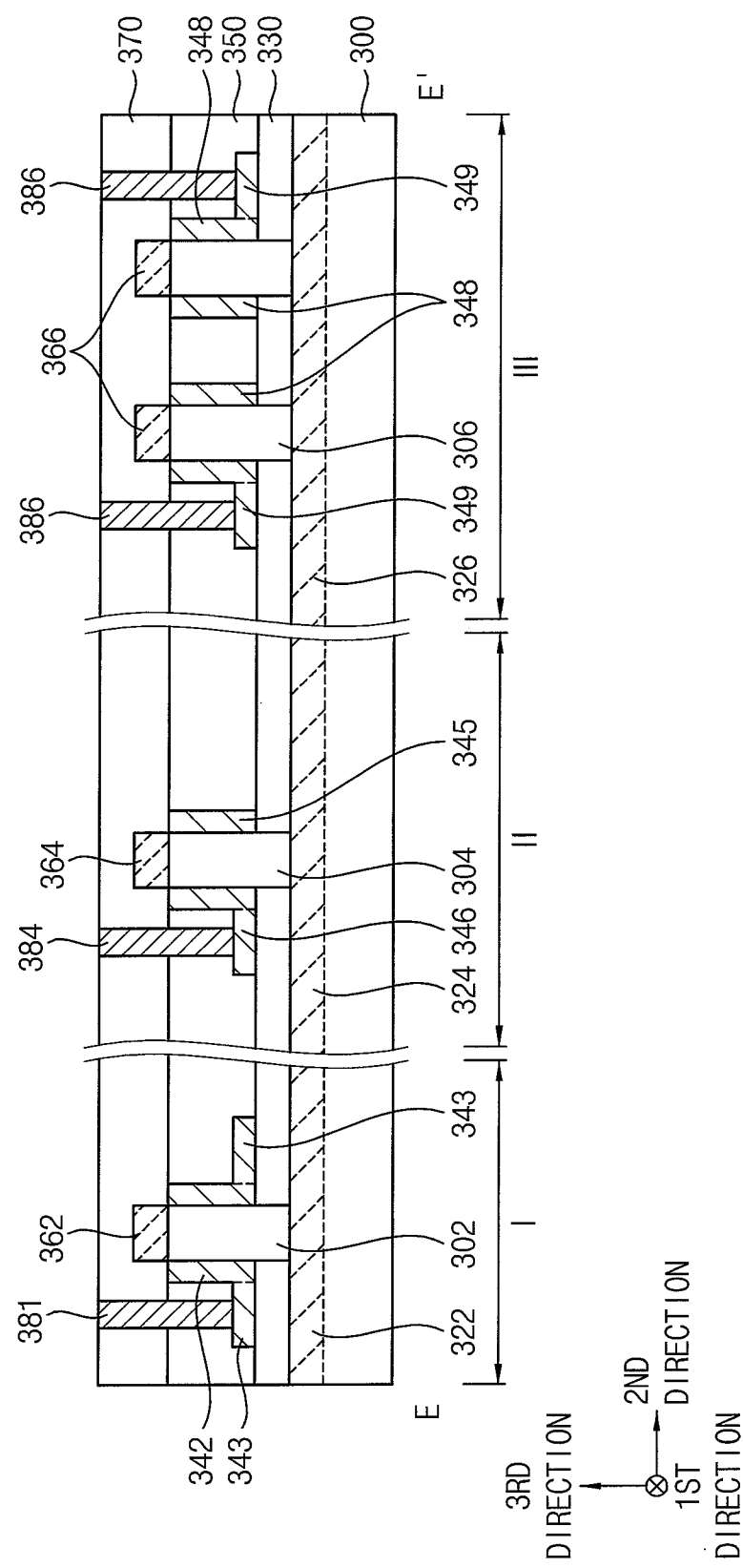
Figure 29:
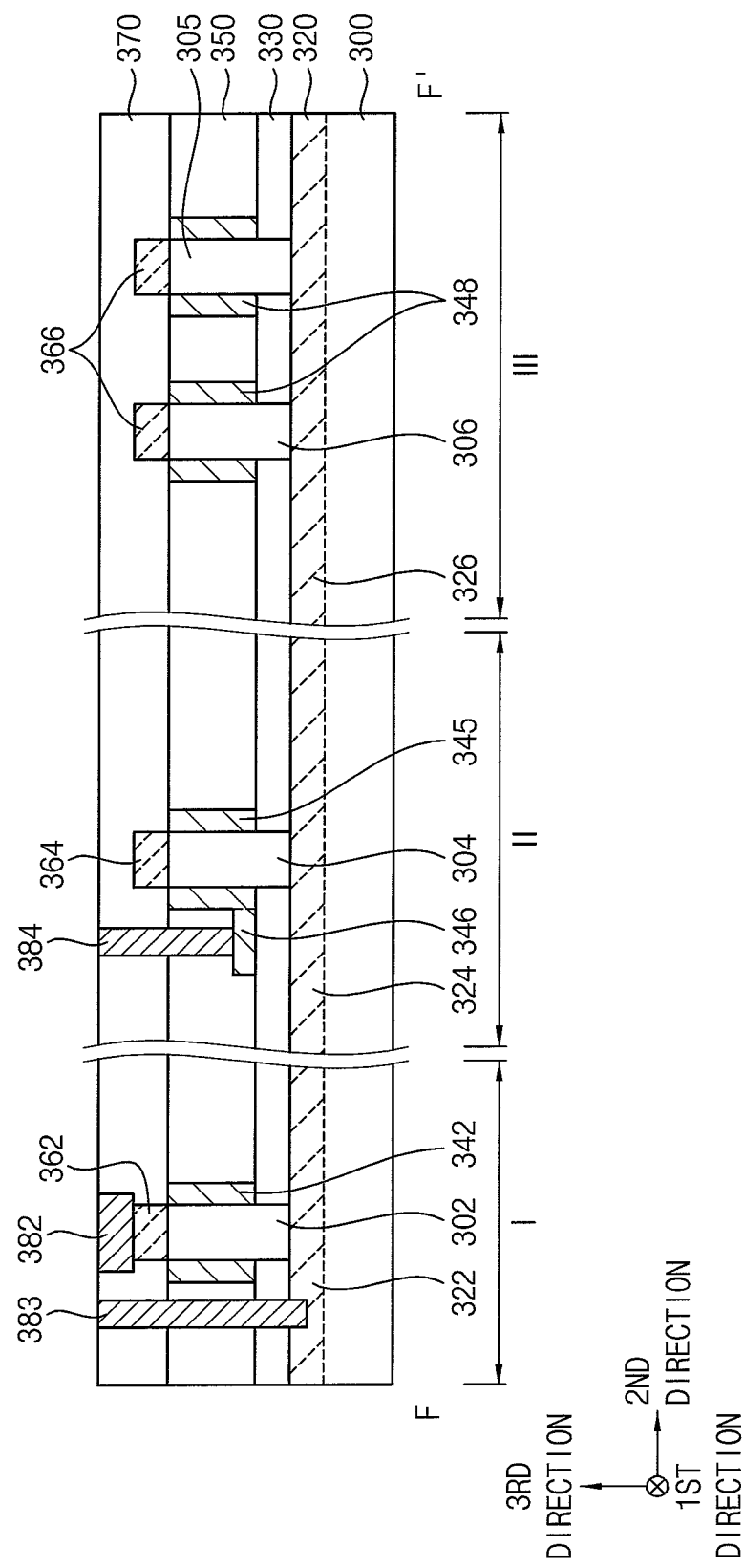

FIGS. 27 to 29 are a plan view and cross-sectional views illustrating a semiconductor device in accordance with exemplary embodiments of the inventive concept. Particularly, FIG. 27 is the plan view, FIG. 28 is a cross-sectional view taken along a line E-E' of FIG. 27, and FIG. 29 is a cross-sectional view taken along a line F-F' of FIG. 27.

This semiconductor device may include an active element such as a transistor, and a passive element such as a resistor and a capacitor. The transistor may be a vertical field effect transistor (vfet) having a vertical channel, and each of the resistor and the capacitor may have a structure similar to that of the vfet. In other words, the vfet may have a structure similar to that of the resistor and/or the capacitor previously illustrated, except for some elements. Thus, repetitive explanations on the same elements are omitted.

In FIGS. 27 to 29, the semiconductor device includes the resistor of FIG. 17 and the capacitor of FIGS. 20 and 21, however, the inventive concept may not be limited thereto. In other words, the semiconductor device may include one or more of the resistors shown in FIGS. 1 and 2, FIG. 12, FIGS. 13 and 14, FIG. 18, and FIG. 19, and one of the capacitor shown in FIGS. 24 to 26.

Referring to FIGS. 27 to 29, the semiconductor device may include first, second and third structures on first, second and third regions I, II and III, respectively, of a substrate 300.

In exemplary embodiments of the inventive concept, the first structure may be a vfet, the second structure may include a resistor, and the third structure may include a capacitor.

The first structure may include a first semiconductor pattern 302, a first lower impurity region 322, a first upper impurity region 362, a spacer 330, third and fourth conductive patterns 342 and 343, and first, second and third contact plugs 381, 382 and 383 on the first region I of the substrate 300. The second structure may include a second semiconductor pattern 304, a second lower impurity region 324, a second upper impurity region 364, the spacer 330, fifth and sixth conductive patterns 345 and 346, and a fourth contact plug 384 on the second region II of the substrate 300. The third structure may include a third semiconductor pattern 306, a third lower impurity region 326, a third upper impurity region 366, the spacer 330, seventh and eighth conductive patterns 348 and 349, and a fifth contact plug 386 on the third region III of the substrate 300.

The first to third lower impurity regions 322, 324 and 326 and the first to third upper impurity regions 362, 364 and 366 may include impurities having the same conductivity type, e.g., n-type or p-type. For example, when the first lower impurity region 322 and the first upper impurity region 362 include n-type impurities, the first structure may be an n-type vfet, and when the first lower impurity region 322 and the first upper impurity region 362 include p-type impurities, the first structure may be a p-type vfet. However, in some cases, an n-type vfet and a p-type vfet both may be formed on the first region I of the substrate 300, and in this case, the second lower and upper impurity regions 324 and 364 and the third lower and upper impurity regions 326 and 366 included in the second and third structures on the second and third regions II and III, respectively, of the substrate 300 may also include both of n-type impurities and p-type impurities.

In exemplary embodiments of the inventive concept, each of the first to third semiconductor patterns 302, 304 and 306 may extend in the first direction, and upper surfaces of the first to third semiconductor patterns 302, 304 and 306 may be substantially coplanar with each other. The first to third semiconductor patterns 302, 304 and 306 may include substantially the same semiconductor material. In FIGS. 27 to 29, one first semiconductor pattern 302 is formed on the first region I of the substrate 300, however, the inventive concept may not be limited thereto. In other words, one or more than one first semiconductor pattern 302 may be formed on the first region I of the substrate 300.

In exemplary embodiments of the inventive concept, the third, fifth and seventh conductive patterns 342, 345 and 348 may surround entire upper sidewalls of the first, second and third semiconductor patterns 302, 304 and 306, respectively. The third, fifth and seventh conductive patterns 342, 345 and 348 may have substantially the same thickness, and upper surfaces of the third, fifth and seventh conductive patterns 342, 345 and 348 may be substantially coplanar with each other. The first to third upper impurity regions 362, 364 and 366 may be formed on the first to third semiconductor patterns 302, 304 and 306, respectively, and thus upper surfaces of the first to third upper impurity regions 362, 364 and 366 may not be covered by the third, fifth and seventh conductive patterns 342, 345 and 348, respectively.

The fourth conductive patterns 343 may be formed on portions of the spacer 330 at opposite sides, respectively, in the second direction of the first semiconductor pattern 302. The sixth conductive patterns 346 may be formed on respective portions of the spacer 330 spaced apart from each other in the first direction at a side in the second direction of the second semiconductor pattern 304. The eighth conductive patterns 349 may be formed on portions of the spacer 330 at opposite sides, respectively, in the second direction of the third semiconductor pattern 306.

On the first region I of the substrate 300, the first contact plug 381 extending through first and second insulating interlayers 350 and 370 to contact an upper surface of the fourth conductive pattern 343, the second contact plug 382 extending through the second insulating interlayer 370 to contact an upper surface of the first upper impurity region 362, and the third contact plug 383 extending through the first and second insulating interlayers 350 and 370 and the spacer 330 to contact an upper surface of the first lower impurity region 322 may be formed. On the second region II of the substrate 300, the fourth contact plug 384 extending through the first and second insulating interlayers 350 and 370 to contact an upper surface of the sixth conductive pattern 346 may be formed. On the third region III of the substrate 300, the fifth contact plug 386 extending through the first and second insulating interlayers 350 and 370 to contact an upper surface of the eighth conductive pattern 349 may be formed.

A first insulation layer including, e.g., silicon oxide and/or a second insulation layer including, e.g., a metal oxide may be further formed between the third to eighth conductive patterns 342, 343, 345, 346, 348 and 349, and the spacer 330 and the first to third semiconductor patterns 302, 304 and 306.

The first structure may include the third conductive pattern 342 serving as a gate electrode, the first lower and upper impurity regions 322 and 362 serving as source/drain regions, and the first semiconductor pattern 302 serving as a channel. In this case, the first structure may be a vfet in which current may flow in the channel in the third direction between the source/drain regions spaced apart from each other in the third direction by a voltage applied through the second and third contact plugs 382 and 383 connected to the first upper and lower impurity regions 362 and 322, respectively.

The fifth conductive pattern 345 in the second structure may surround the upper sidewall of the second semiconductor pattern 304, and electrical signals may be applied to the fifth conductive pattern 345 by the sixth conductive pattern 346 and the fourth contact plugs 384, so that the fifth conductive pattern 345 may serve as a resistor. No contact plugs may be connected to the second lower and upper impurity regions 324 and 364 in the second structure so that no electrical signals may be applied thereto. Even if electrical signals are applied to the second lower and upper impurity regions 324 and 364, the second semiconductor pattern 304 may be in a floating state in the circuit. In other words, the second structure may be a passive element unlike the first structure, and the fifth conductive pattern 345 and the second semiconductor pattern 304 in the second structure may not serve as a gate structure and a channel of a transistor.

Electrical signals may be applied to the seventh conductive patterns 348 in the third structure by the eighth conductive patterns 349 and the fifth contact plugs 386, and the seventh conductive patterns 348 and the first insulating interlayer 350 therebetween may serve as a capacitor. No contact plugs may be connected to the third lower and upper impurity regions 326 and 366 in the third structure so that no electrical signals may be applied thereto. Even if electrical signals are applied to the third lower and upper impurity regions 326 and 366, the third semiconductor pattern 306 may be in a floating state in the circuit. In other words, the third structure may be a passive element unlike the first structure, and the seventh conductive patterns 348 and the third semiconductor pattern 306 in the third structure may not serve as a gate structure and a channel of a transistor.

The first to third structures may have similar structures with each other, except for some elements, and may be formed by the same method subsequently illustrated.

When the vfet is an n-type or a p-type transistor, the third conductive pattern 342 may include a metal, a metal nitride, a metal alloy, etc., having a proper workfunction, and thus the fifth conductive pattern 345 serving as a resistor and/or the seventh conductive patterns 348 serving as an electrode of a capacitor may also include the same material. Accordingly, by changing the material of the third conductive pattern 342, the resistor may have a desired specific resistivity.

Figure 30:
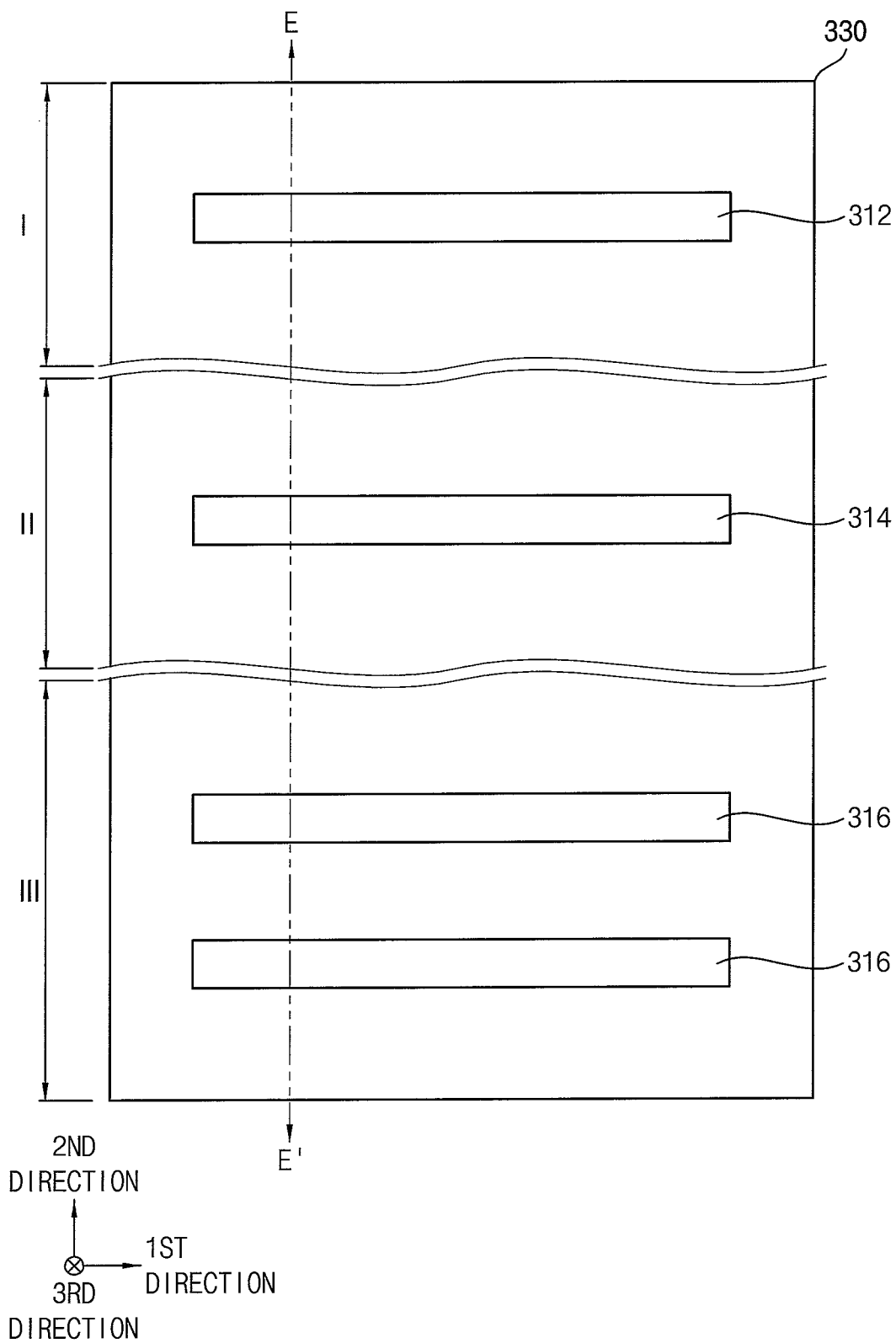
FIGS. 30, 31, 32, 33, 34 and 35 are plan views and cross-sectional views illustrating a method of manufacturing a semiconductor device in accordance with exemplary embodiments of the inventive concept.
Figure 31:
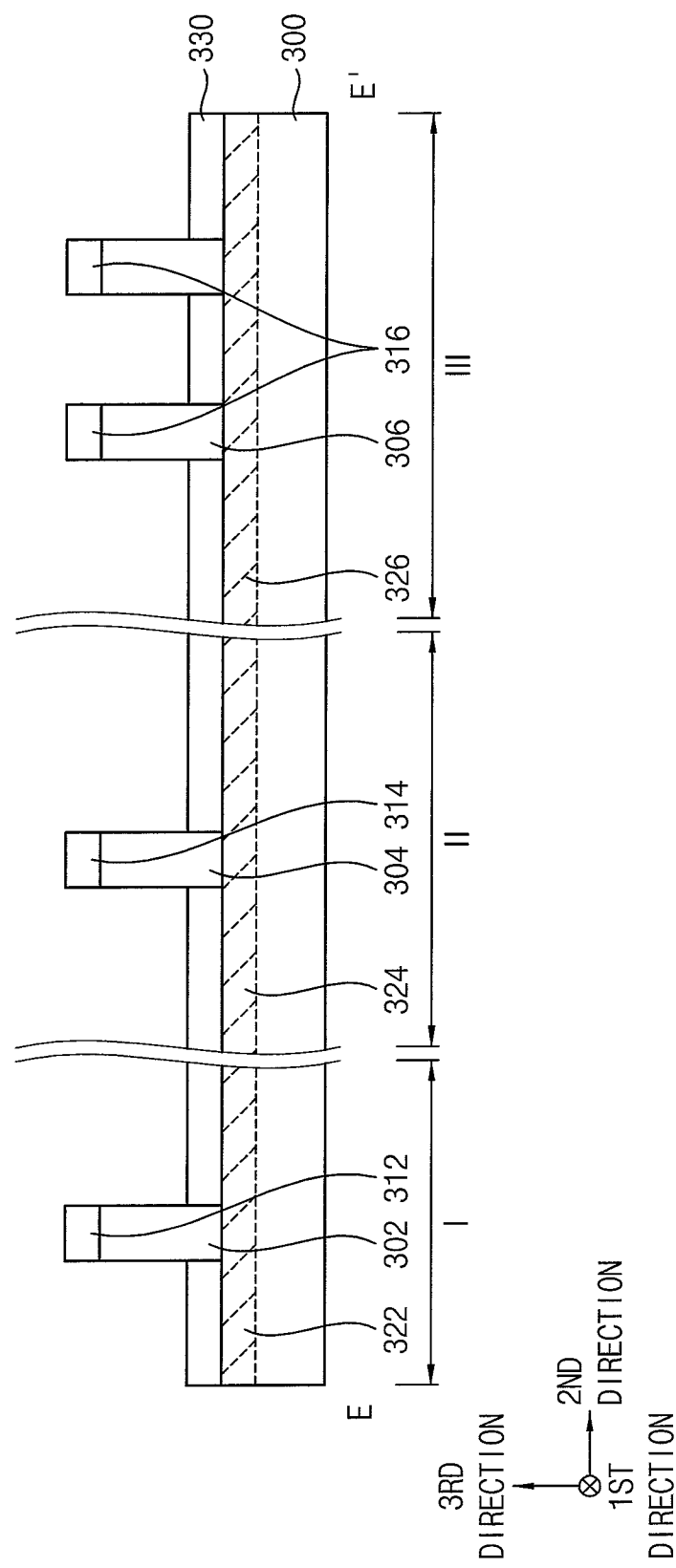
Figure 32:
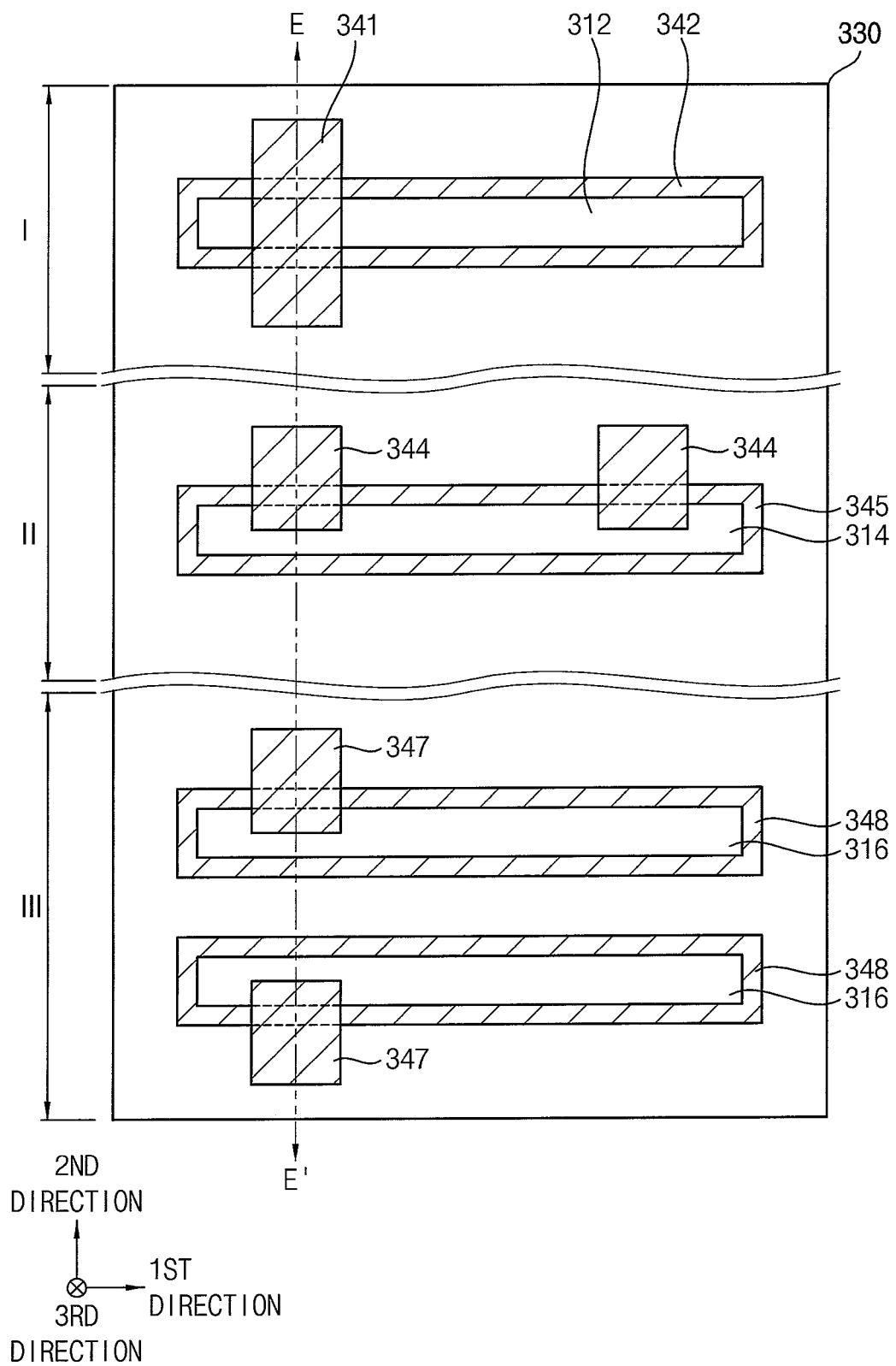
Figure 33:
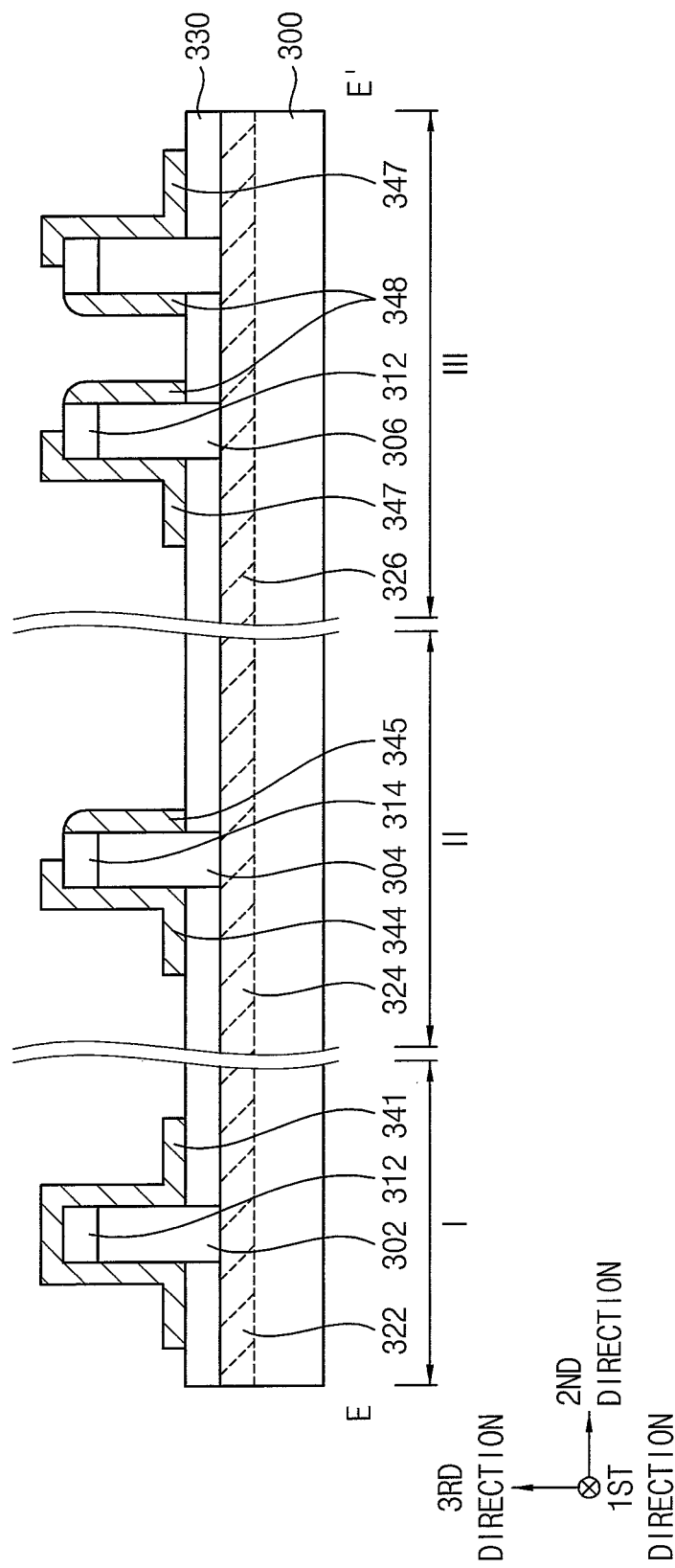
Figure 34:
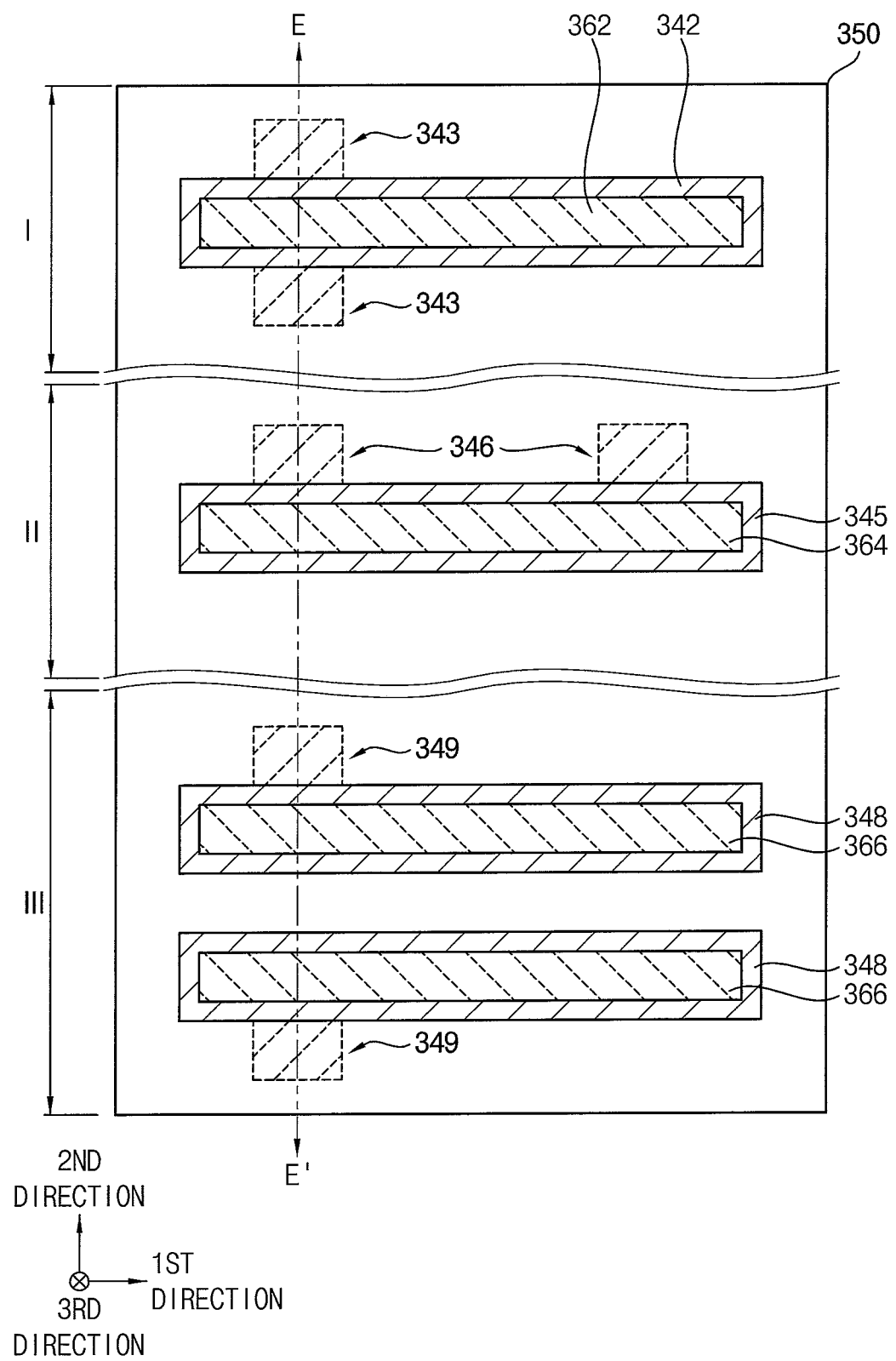
Figure 35:
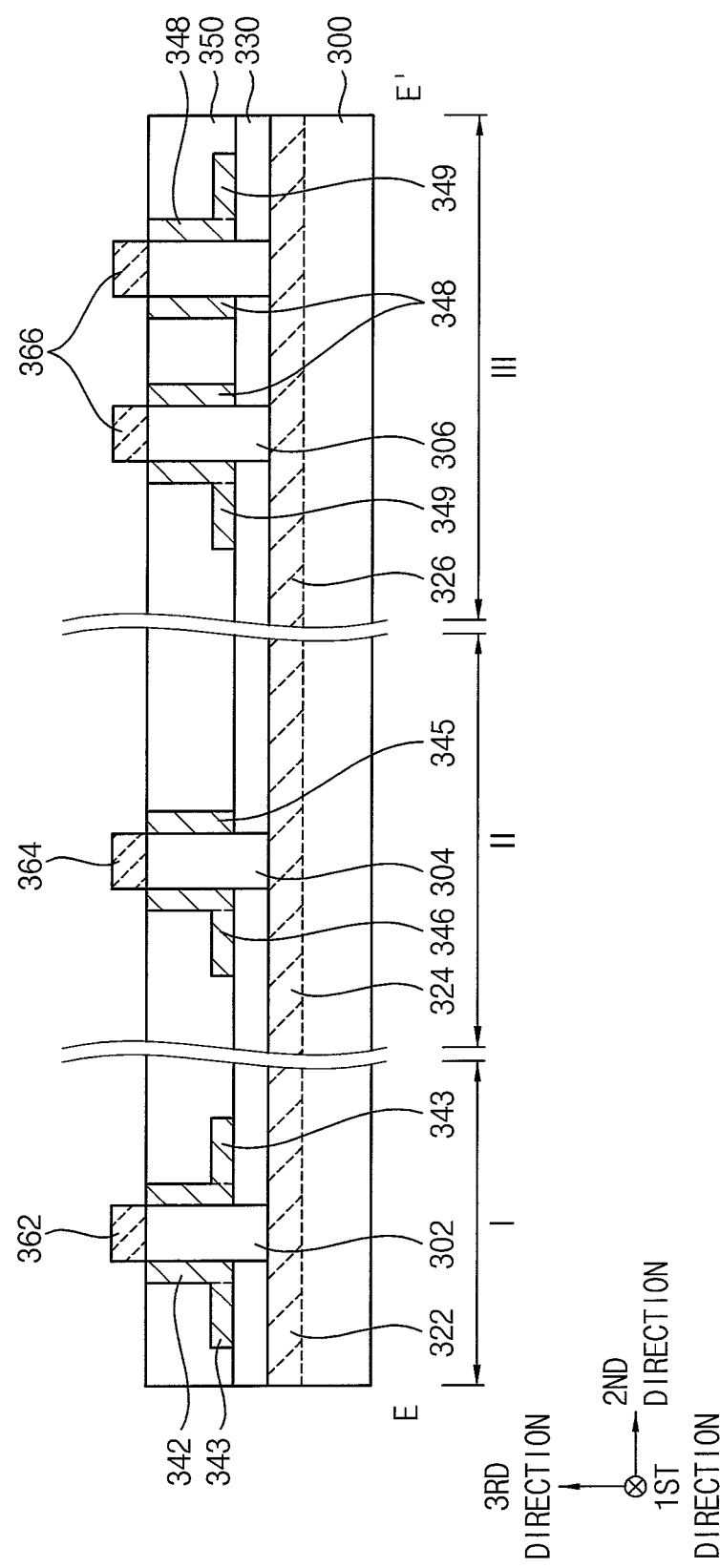

FIGS. 30 to 35 are plan views and cross-sectional views illustrating a method of manufacturing a semiconductor device in accordance with exemplary embodiments of the inventive concept. Particularly, FIGS. 30, 32 and 34 are the plan views, and FIGS. 31, 33 and 35 are cross-sectional views taken along lines E-E' of corresponding plan views. This method may include processes substantially the same as or similar to those illustrated with reference to FIGS. 1 to 11 or FIGS. 20 to 23, and thus repetitive explanations thereon are omitted.

Referring to FIGS. 30 and 31, processes substantially the same as or similar to those illustrated with reference to FIGS. 3 to 4 may be performed.

In other words, first, second and third hard masks 312, 314 and 316 may be formed on the first, second and third regions I, II and III, respectively, of the substrate 300, upper portions of the substrate 300 may be etched using the first to third hard masks 312, 314 and 316 as an etching mask to form first to third semiconductor patterns 302, 304 and 306, respectively, protruding upwardly from the substrate 300 in the third direction on the first to third regions I, II and III of the substrate 300.

In an exemplary embodiment of the inventive concept, an ion implantation process may be performed on an upper portion of the substrate 300 to form first to third lower impurity regions 322, 324 and 326 on the first to third regions I, II and III, respectively, of the substrate 300. Each of the first to third lower impurity regions 322, 324 and 326 may be formed at an entire upper portion of the respective region of the substrate 300, or a plurality of first lower impurity regions 322, a plurality of second lower impurity regions 324, and a plurality of third lower impurity regions 326 may be formed in the respective region of the substrate 300.

A spacer 330 may be formed to cover lower sidewalls of the first to third semiconductor patterns 302, 304 and 306.

Referring to FIGS. 32 and 33, processes substantially the same as or similar to those illustrated with reference to FIGS. 5 to 7 or FIGS. 22 to 23 may be performed so that a preliminary fourth conductive pattern 341 and a third conductive pattern 342 may be formed on the first region I of the substrate 300, a preliminary sixth conductive pattern 344 and a fifth conductive pattern 345 may be formed on the second region II of the substrate 300, and a preliminary eighth conductive pattern 347 and a seventh conductive pattern 348 may be formed on the third region III of the substrate 300.

In exemplary embodiments of the inventive concept, the third, fifth and seventh conductive patterns 342, 345 and 348 may cover the first, second and third semiconductor patterns 302, 304 and 306, respectively, and the first, second and third hard masks 312, 314 and 316, respectively. The preliminary fourth conductive pattern 341 may extend in the second direction to cover the first semiconductor pattern 302, the first hard mask 312, and a portion of the spacer 330 adjacent thereto in the second direction. A pair of preliminary sixth conductive patterns 344 may be formed to be spaced apart from each other in the first direction, and each of the preliminary sixth conductive patterns 344 may cover sidewalls of the second semiconductor pattern 304 and the second hard mask 314 adjacent thereto, a portion of the second hard mask 314 adjacent thereto, and a portion of the spacer 330 adjacent thereto. A pair of preliminary eighth conductive patterns 347 be formed to be spaced apart from each other in the second direction, and may cover sidewalls of a pair of third semiconductor patterns 306 and a pair of third hard masks 316, upper surfaces of the third hard masks 316 adjacent thereto, and portions of the spacer 330 adjacent thereto.

In FIGS. 32 and 33, the preliminary fourth conductive pattern 341 covers the first semiconductor pattern 302, the first hard mask 312, and portions of the spacer 330 at opposite sides in the second direction of the first semiconductor pattern 302 and the first hard mask 312, however, the inventive concept may not be limited thereto. For example, the preliminary fourth conductive pattern 341 may cover a portion of the spacer 330 at one side in the second direction of the first semiconductor pattern 302 and the first hard mask 312.

Referring to FIGS. 34 and 35, processes substantially the same as or similar to those illustrated with reference to FIGS. 8 to 11 may be performed.

Thus, third, fifth and seventh conductive patterns 342, 345 and 348 may be formed to surround upper sidewalls of the first, second and third semiconductor patterns 302, 304 and 306, respectively. Fourth conductive patterns 343 may be formed on respective portions of the spacer 330 at opposite sides in the second direction of the first semiconductor pattern 302, sixth conductive patterns 346 may be formed on respective portions of the spacer 330 at one sidewall in the second direction of the second semiconductor pattern 304, and eighth conductive patterns 349 may be formed on respective portions of the spacer 330 at opposite sides in the second direction of a pair of the third semiconductor patterns 306.

First to third upper impurity regions 362, 364 and 366 may be formed at respective upper portions of the first to third semiconductor patterns 302, 304 and 306, and a first insulating interlayer 350 may be formed on the spacer 330 to cover the fourth, sixth and eighth conductive patterns 343, 346 and 349 and sidewalls of the third, fifth and seventh conductive patterns 342, 345 and 348.

Referring to FIGS. 27 to 29, processes substantially the same as or similar to those illustrated with reference to FIGS. 1 and 2 may be performed to complete the fabrication of the semiconductor device.

First to third contact plugs 381, 382 and 383 may be formed on the first region I of the substrate 300, a fourth contact plug 384 may be formed on the second region II of the substrate 300, and a fifth contact plug 386 may be formed on the third region III of the substrate 300.

As illustrated above, the vfet, the resistor, and the capacitor may be formed on the first, second, third regions I, II and III, respectively, of the substrate 300, which may have substantially the same structure except for some elements. Thus, additional processes for forming the resistor and the capacitor are not needed so as to decrease process time and cost.

The semiconductor device according to an exemplary embodiment of the inventive concept may include a passive element such as a resistor and a capacitor having the similar structure to that of a vfet, and thus no additional processes for forming the passive element are needed. The resistor and the capacitor may be formed on a sidewall of a semiconductor pattern protruding in the vertical direction, and thus may have a reduced horizontal area. The resistor and the capacitor may have a desired specific resistivity and capacitance through a connection pattern for connecting conductive patterns with each other.

While the inventive concept has been particularly shown and described with reference to exemplary embodiments thereof, it will be understood by one of ordinary skill in the art that variations in form and detail may be made thereto without departing from the spirit and scope of the inventive concept as set forth in the claims.

What is claimed is:

1. A semiconductor device, comprising:
   a first structure including:
      a first semiconductor pattern protruding from a substrate in a vertical direction perpendicular to an upper surface of the substrate, the first semiconductor pattern being a channel;
      a first conductive pattern surrounding an upper sidewall of the first semiconductor pattern and not covering an upper surface of the first semiconductor pattern, the first conductive pattern being a gate electrode;
      a first lower impurity region at an upper portion of the substrate under the first semiconductor pattern, the first lower impurity region contacting a lower surface of the first semiconductor pattern, the first lower impurity region being a source region or a drain region; and
      a first upper impurity region contacting the upper surface of the first semiconductor pattern, the first upper impurity region being the other of the source region or the drain region; and
   a second structure including:
      second semiconductor patterns spaced apart from each other in a horizontal direction parallel to the upper surface of the substrate, each of the second semiconductor patterns protruding from the substrate in the vertical direction;
      second conductive patterns surrounding upper sidewalls of the second semiconductor patterns, respectively, and not covering upper surfaces of the second semiconductor patterns;
      a connection pattern on the substrate, the connection pattern connects the second conductive patterns with each other and includes substantially the same material as the second conductive patterns; and
      first contact plugs electrically connected to the second conductive patterns,
   wherein the first structure is a vertical field effect transistor (vfet), and the second structure includes a resistor or a capacitor.

2. The semiconductor device of claim 1, wherein the first and second semiconductor patterns include substantially the same semiconductor material, the first and second conductive patterns include substantially the same metal, and the first lower and upper impurity regions include impurities having the same conductivity type.

3. The semiconductor device of claim 1, wherein the upper surfaces of the first and second semiconductor patterns are substantially coplanar with each other, and the first and second conductive patterns have substantially the same thickness.

4. The semiconductor device of claim 1, wherein the upper surfaces of the first and second semiconductor patterns are substantially coplanar with upper surfaces of the first and second conductive patterns, respectively.

5. The semiconductor device of claim 1, further comprising a spacer on the substrate, the spacer covering lower sidewalls of the first and second semiconductor patterns,
   wherein the first and second conductive patterns are formed on the spacer.

6. The semiconductor device of claim 1, further comprising:

a second contact plug electrically connected to the first conductive pattern;

a third contact plug contacting the first upper impurity region; and a fourth contact plug contacting the first lower impurity region.

7. The semiconductor device of claim 6, further comprising a third conductive pattern on the substrate, the third conductive pattern being connected to the first conductive pattern, wherein the second contact plug contacts an upper surface of the third conductive pattern.

8. The semiconductor device of claim 1, wherein the second conductive patterns of the second structure are the resistor.

9. The semiconductor device of claim 1, further comprising pads on the substrate, the pads including substantially the same material as the second conductive patterns, and each of the pads being at a side of one of the second conductive patterns, wherein the first contact plugs contact upper surfaces of the pads, respectively.

10. The semiconductor device of claim 8, further comprising:

a second lower impurity region at the upper portion of the substrate under the second semiconductor patterns, the second lower impurity region contacting a lower surface of the second semiconductor patterns; and a second upper impurity region contacting the upper surfaces of the second semiconductor patterns, wherein no electrical signals are applied to the second lower impurity region or the second upper impurity region.

11. The semiconductor device of claim 1, further comprising an insulating interlayer between the second conductive patterns, wherein the second conductive patterns of the second structure and the insulating interlayer are the capacitor.

12. The semiconductor device of claim 11, further comprising pads including substantially the same material as the second conductive patterns, each of the pads being at one side of one of the second conductive patterns on the substrate, wherein the first contact plugs contact upper surfaces of the pads, respectively.

13. The semiconductor device of claim 11, further comprising:

a second lower impurity region at the upper portion of the substrate under the second semiconductor patterns, the second lower impurity region contacting a lower surface of the second semiconductor patterns; and a second upper impurity region contacting the upper surfaces of the second semiconductor pattern, wherein no electrical signals are applied to the second lower impurity region or the second upper impurity region.

14. A semiconductor device, comprising:

a semiconductor pattern protruding from a substrate in a vertical direction perpendicular to an upper surface of the substrate;

a conductive pattern at least partially surrounding and directly contacting an upper sidewall of the semiconductor pattern and not covering an upper surface of the semiconductor pattern;

a lower impurity region at an upper portion of the substrate under the semiconductor pattern, the lower impurity region contacting a lower surface of the semiconductor pattern;

an upper impurity region contacting the upper surface of the semiconductor pattern;

pads connected to the conductive pattern, the pads including substantially the same conductive material as the conductive pattern; and contact plugs on the pads, respectively, wherein no electrical signals are applied to the lower and upper impurity regions, and electrical signals are applied to the conductive pattern through the contact, plugs so that the conductive pattern is a resistor.

15. The semiconductor device, of claim 14, further comprising a spacer on the substrate, the spacer covering a lower sidewall of the semiconductor pattern, wherein the conductive pattern is formed on the spacer.

16. The semiconductor device of claim 14, wherein the semiconductor pattern extends in a first direction substantially parallel to the upper surface of the substrate, and is one of a plurality of semiconductor patterns spaced apart from each other in a second direction substantially parallel to the upper surface of the substrate and crossing the first direction, wherein a plurality of conductive patterns are formed on the upper sidewalls of the plurality of semiconductor patterns, respectively, and wherein the semiconductor device further comprises a connection pattern for connecting the plurality of conductive patterns with each other, the connection pattern including substantially the same material as the plurality of conductive patterns.

17. The semiconductor device of claim 16, wherein each of the plurality of conductive patterns surrounds an upper surface of a respective one of the plurality of semiconductor patterns except for the end portion of the semiconductor pattern, and wherein a sidewall in the first direction of each of the conductive patterns is aligned in the second direction with sidewalls in the first direction of the pads and the connection pattern.

* * * * *